United States Patent
Chen et al.

(10) Patent No.: US 9,647,697 B2
(45) Date of Patent: May 9, 2017

(54) METHOD AND SYSTEM FOR DETERMINING SOFT INFORMATION OFFSETS

(71) Applicant: SanDisk Enterprise IP LLC, Milpitas, CA (US)

(72) Inventors: Xiaoheng Chen, Dublin, CA (US); Jingyu Kang, San Jose, CA (US); Jiangli Zhu, San Jose, CA (US); Ying Yu Tai, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/965,578

(22) Filed: Dec. 10, 2015

(65) Prior Publication Data

US 2016/0274969 A1 Sep. 22, 2016

Related U.S. Application Data

(60) Provisional application No. 62/133,957, filed on Mar. 16, 2015.

(51) Int. Cl.
*H03M 13/00* (2006.01)
*G11C 29/00* (2006.01)
*G06F 11/00* (2006.01)
*H03M 13/45* (2006.01)
(Continued)

(52) U.S. Cl.
CPC ......... *H03M 13/45* (2013.01); *G06F 11/1012* (2013.01); *G11C 11/5642* (2013.01);
(Continued)

(58) Field of Classification Search
CPC .............. H03M 13/45; H03M 13/1111; H03M 13/3723; H03M 13/3746; H03M 13/6325;
(Continued)

(56) References Cited

U.S. PATENT DOCUMENTS 4,586,167 A 4/1986 Fujishima et al.
5,559,988 A 9/1996 Durante et al.
(Continued)

FOREIGN PATENT DOCUMENTS

EP 0 376 285 A2 7/1990
WO WO 2012/083308 6/2012

OTHER PUBLICATIONS

Seagate Technology, "SCSI Commands Reference Manual, Rev. C", Product Manual dated Apr. 2010, pp. 211-214.
(Continued)

*Primary Examiner* — Christine Tu
(74) *Attorney, Agent, or Firm* — Morgan, Lewis & Bockius LLP

(57) ABSTRACT

Systems, methods, and/or devices are used to improve decoding of data read from a storage device with one or more memory devices. In one aspect, the method includes obtaining, in response to a read request, a codeword with two or more codeword portions from distinct memory portions of the storage device. When a decoding iteration on the codeword fails to satisfy predetermined decoding criteria, the method includes, for the two or more codeword portions of the codeword: determining a bit-flip count between raw read data for a respective codeword portion and a decoding result for the respective codeword portion after the decoding iteration; determining a soft information offset for the respective codeword portion based on the bit-flip count for the respective codeword portion relative to bit-flips counts for other codeword portions; and adjusting soft information for the respective codeword portion based on the soft information offset.

23 Claims, 14 Drawing Sheets

(51) Int. Cl.
| | |
|---|---|
| *H03M 13/11* | (2006.01) |
| *H03M 13/37* | (2006.01) |
| *G06F 11/10* | (2006.01) |
| *G11C 11/56* | (2006.01) |
| *G11C 29/02* | (2006.01) |
| *G11C 29/52* | (2006.01) |
| *H03M 13/15* | (2006.01) |
| *H03M 13/29* | (2006.01) |
| *G11C 29/04* | (2006.01) |

(52) U.S. Cl.
CPC ....... *G11C 29/028* (2013.01); *H03M 13/1111* (2013.01); *H03M 13/3723* (2013.01); *H03M 13/3746* (2013.01); *H03M 13/6325* (2013.01); *G11C 29/52* (2013.01); *G11C 2029/0411* (2013.01); *H03M 13/152* (2013.01); *H03M 13/1515* (2013.01); *H03M 13/2957* (2013.01)

(58) Field of Classification Search
CPC ........... H03M 13/1515; H03M 13/152; H03M 13/2957; G11C 11/5642; G11C 29/028; G11C 29/52; G11C 2029/0411; G06F 11/1012

See application file for complete search history.

(56) References Cited

U.S. PATENT DOCUMENTS

| | | | |
|---|---|---|---|
| 5,909,559 A | 6/1999 | So | |
| 6,247,136 B1 | 6/2001 | MacWilliams et al. | |
| 6,292,410 B1 | 9/2001 | Yi et al. | |
| 6,401,213 B1 | 6/2002 | Jeddeloh | |
| 6,449,709 B1 | 9/2002 | Gates | |
| 8,122,202 B2 | 2/2012 | Gillingham | |
| 8,213,255 B2 | 7/2012 | Hemink et al. | |
| 8,429,498 B1* | 4/2013 | Anholt ................ | G06F 11/1048 365/227 |
| 8,479,080 B1 | 7/2013 | Shalvi et al. | |
| 8,595,590 B1* | 11/2013 | Vojcic ................... | H04L 1/0041 375/262 |
| 8,825,967 B2 | 9/2014 | Hong Beom | |
| 8,984,376 B1 | 3/2015 | Norrie | |
| 9,170,876 B1 | 10/2015 | Bates et al. | |
| 2003/0115403 A1 | 6/2003 | Bouchard et al. | |
| 2003/0122834 A1 | 7/2003 | Mastronarde et al. | |
| 2004/0117441 A1 | 6/2004 | Liu et al. | |
| 2005/0248992 A1 | 11/2005 | Hwang et al. | |
| 2007/0002629 A1 | 1/2007 | Lee et al. | |
| 2007/0233937 A1 | 10/2007 | Coulson et al. | |
| 2008/0140914 A1 | 6/2008 | Jeon | |
| 2009/0168525 A1 | 7/2009 | Olbrich et al. | |
| 2009/0177943 A1 | 7/2009 | Silvus et al. | |
| 2009/0222627 A1 | 9/2009 | Reid | |
| 2009/0282191 A1 | 11/2009 | Depta | |
| 2010/0005217 A1 | 1/2010 | Jeddeloh | |
| 2010/0014364 A1 | 1/2010 | Laberge et al. | |
| 2010/0165730 A1* | 7/2010 | Sommer ............. | G06F 11/1068 365/185.03 |
| 2010/0174845 A1 | 7/2010 | Gorobets et al. | |
| 2010/0174853 A1 | 7/2010 | Lee et al. | |
| 2010/0220509 A1 | 9/2010 | Sokolov et al. | |
| 2010/0250874 A1 | 9/2010 | Farrell et al. | |
| 2011/0113204 A1 | 5/2011 | Henriksson et al. | |
| 2011/0235434 A1 | 9/2011 | Byom et al. | |
| 2011/0252215 A1 | 10/2011 | Franceschini et al. | |
| 2011/0264851 A1 | 10/2011 | Jeon et al. | |
| 2011/0302474 A1 | 12/2011 | Goss et al. | |
| 2012/0030408 A1 | 2/2012 | Flynn et al. | |
| 2012/0047317 A1 | 2/2012 | Yoon et al. | |
| 2012/0159070 A1 | 6/2012 | Baderdinni et al. | |
| 2012/0198129 A1 | 8/2012 | Van Aken et al. | |
| 2012/0224425 A1 | 9/2012 | Fai et al. | |
| 2013/0007380 A1 | 1/2013 | Seekins et al. | |
| 2013/0070507 A1 | 3/2013 | Yoon | |
| 2013/0111289 A1 | 5/2013 | Zhang et al. | |
| 2013/0111290 A1 | 5/2013 | Zhang et al. | |
| 2013/0132650 A1 | 5/2013 | Choi et al. | |
| 2013/0182506 A1 | 7/2013 | Melik-Martirosian | |
| 2013/0219106 A1 | 8/2013 | Vogan et al. | |
| 2013/0254498 A1 | 9/2013 | Adachi et al. | |
| 2013/0297894 A1 | 11/2013 | Cohen et al. | |
| 2013/0346805 A1 | 12/2013 | Sprouse et al. | |
| 2014/0006688 A1 | 1/2014 | Yu et al. | |
| 2014/0047170 A1 | 2/2014 | Cohen et al. | |
| 2014/0143637 A1 | 5/2014 | Cohen et al. | |
| 2014/0173239 A1 | 6/2014 | Schushan | |
| 2014/0229655 A1 | 8/2014 | Goss et al. | |
| 2014/0229656 A1 | 8/2014 | Goss et al. | |
| 2014/0241071 A1 | 8/2014 | Goss et al. | |
| 2014/0244897 A1 | 8/2014 | Goss et al. | |
| 2014/0258598 A1 | 9/2014 | Canepa et al. | |
| 2014/0281833 A1* | 9/2014 | Kroeger ............. | H03M 13/1102 714/776 |
| 2014/0310241 A1 | 10/2014 | Goyen | |
| 2015/0074487 A1 | 3/2015 | Patapoutian et al. | |
| 2015/0095558 A1 | 4/2015 | Kim et al. | |
| 2015/0186278 A1 | 7/2015 | Jayakumar et al. | |
| 2015/0301749 A1 | 10/2015 | Seo et al. | |
| 2015/0331627 A1 | 11/2015 | Kwak | |
| 2016/0026386 A1 | 1/2016 | Ellis et al. | |
| 2016/0034194 A1 | 2/2016 | Brokhman et al. | |
| 2016/0062699 A1 | 3/2016 | Samuels et al. | |
| 2016/0070493 A1 | 3/2016 | Oh et al. | |
| 2016/0117099 A1 | 4/2016 | Prins et al. | |
| 2016/0117105 A1 | 4/2016 | Thangaraj et al. | |
| 2016/0117252 A1 | 4/2016 | Thangaraj et al. | |
| 2016/0170671 A1 | 6/2016 | Huang | |
| 2016/0170831 A1 | 6/2016 | Lesatre et al. | |
| 2016/0179403 A1 | 6/2016 | Kurotsuchi et al. | |
| 2016/0299699 A1 | 10/2016 | Vanaraj et al. | |
| 2016/0299704 A1 | 10/2016 | Vanaraj et al. | |
| 2016/0299724 A1 | 10/2016 | Vanaraj et al. | |
| 2016/0342344 A1 | 11/2016 | Kankani et al. | |
| 2016/0342345 A1 | 11/2016 | Kankani et al. | |

OTHER PUBLICATIONS

Tanenbaum, "Structured Computer Organization", 3rd edition 1990, section 1.4, p. 11, 3 pages.

International Search Report and Written Opinion dated Nov. 18, 2015, received in International Patent Application No. PCT/US2015/039552 which corresponds to U.S. Appl. No. 14/559,183, 11 pages (Ellis).

International Search Report and Written Opinion dated Jul. 4, 2016, received in International Patent Application No. PCT/US2016/028477, which corresponds to U.S. Appl. No. 14/883,540, 11 pages (Hodgdon).

International Search Report and Written Opinion dated Nov. 9, 2015, received in International Patent Application No. PCT/US2015/053551, which corresponds to U.S. Appl. No. 14/668,690, 12 pages (Thangaraj).

International Search Report and Written Opinion dated Nov. 11, 2015, received in International Patent Application No. PCT/US2015/053582, which corresponds to U.S. Appl. No. 14/659,493, 12 pages (Prins).

International Search Report and Written Opinion dated Sep. 8, 2016, received in International Patent Application No. PCT/US2016/036716, which corresponds to U.S. Appl. No. 14/925,945, 13 pages (Ellis).

Atmel Data-sheet, "9-to-bit Selectable, ±0.5°C. Accurate Digital Temperature Sensor with Nonvolatile Registers and Serial EEPROM" www.atmel.com/images/Atmel-8854-DTS-AT30TSE752A-754A-758A-Datasheet.pdf, Atmel Data-sheet, Mar 1, 2011, - Atmel-8854-DTS-AT30TSE752A-754A-758A-Datasheet_102014, 57 pages.

* cited by examiner

Characterization Metrics Table 338

Entry 343-A

- Physical Address(es) 362
- Characterization Metrics 364
  - Word Line Position 366
  - Bytes Written 368
  - PE Cycles 370
  - BER 372
  - Other Usage Info 374
  - Status Metric 376
- ECC Type 378
- Storage Density 380
- Other Info 382

⋮

Entry 343-B

⋮

Entry 343-N

Soft Information Offset Table 342

| Bit Flip Delta 382 | Soft Info Offset (Set A) 384 | Soft Info Offset (Set B) 386 |
|---|---|---|
| 0 | 0 | 0 |
| 10 | 1 | -1 |
| -10 | -1 | 1 |
| 20 | 2 | -2 |
| -20 | -2 | 2 |
| ⋮ | ⋮ | ⋮ |

Soft Information Offset Table 342-A

| Bit Flip (set) − Avg (Bit Flip for all set) 387 | Soft Info Offset (Set A) 388 |
|---|---|
| 0 | 0 |
| 10 | 1 |
| -10 | -1 |
| 20 | 2 |
| -20 | -2 |
| ⋮ | ⋮ |

400

| $x_b$ \ $y_b$ | 0 | 1 |
|---|---|---|
| $V_0$ | $p_{00}$ | $p_{10}$ |
| $V_1$ | $p_{01}$ | $p_{11}$ |

Figure 4A

Characterization Vector 402

Storage Medium Characterization Parameters 410

| Parameter 1 (e.g., combined status metric) | 411 |
| Parameter 2 (e.g., temperature) | 412 |
| ⋮ | |
| Parameter n-1 (e.g. PE cycles) | 413 |
| Parameter n (e.g., word line zone) | 414 |

Reading Threshold Voltage(s) 420

| $V_{RA}$ | 421a |
| $V_{RB}$ | 421b |
| $V_{RC}$ | 421c |

Single-Page Read - LLR Values 430

| Read Data 431 | LLR (lower page) 432 | LLR (upper page) 433 |
|---|---|---|
| 0 | LLR($y_b = V_0$) | LLR($y_b = V_0$) |
| 1 | LLR($y_b = V_1$) | LLR($y_b = V_1$) |

| x \ y | 11 or '3' | 01 or '1' | 00 or '0' | 10 or '2' |
|---|---|---|---|---|
| $V_{11}$ or $V_3$ | $p_{33}$ | $p_{13}$ | $p_{03}$ | $p_{23}$ |
| $V_{01}$ or $V_1$ | $p_{31}$ | $p_{11}$ | $p_{01}$ | $p_{21}$ |
| $V_{00}$ or $V_0$ | $p_{30}$ | $p_{10}$ | $p_{00}$ | $p_{20}$ |
| $V_{10}$ or $V_2$ | $p_{32}$ | $p_{12}$ | $p_{02}$ | $p_{22}$ |

Figure 5A

Characterization Vector 502

Storage Medium Characterization Parameters 510

Parameter 1 (e.g., combined status metric) — 511
  Parameter 2 (e.g., temperature) — 512
  ⋮
  Parameter n-1 (e.g. PE cycles) — 513
  Parameter n (e.g., word line zone) — 514

Reading Threshold Voltage(s) 520

$V_{RA}$ — 521a
  $V_{RB}$ — 521b
  $V_{RC}$ — 521c

Joint-Page Read - LLR Values 530

| Read Data (531) | LLR (lower page) (532) | LLR (upper page) (533) |
|---|---|---|
| 11 | $LLR(y_0^{11})$ | $LLR(y_1^{11})$ |
| 01 | $LLR(y_0^{01})$ | $LLR(y_1^{01})$ |
| 00 | $LLR(y_0^{00})$ | $LLR(y_1^{00})$ |
| 10 | $LLR(y_0^{10})$ | $LLR(y_1^{10})$ |

Figure 5B

METHOD AND SYSTEM FOR DETERMINING SOFT INFORMATION OFFSETS

RELATED APPLICATIONS

This application claims priority to U.S. Provisional Patent Application No. 62/133,957, filed Mar. 16, 2015, which is hereby incorporated by reference in its entirety.

TECHNICAL FIELD

The disclosed embodiments relate generally to memory systems, and in particular, to improving the reliability with which a storage device (e.g., comprising one or more flash memory devices) retains data.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Increases in storage density have been facilitated in various ways, including increasing the density of memory cells on a chip enabled by manufacturing developments, and transitioning from single-level flash memory cells to multi-level flash memory cells, so that two or more bits can be stored by each flash memory cell.

A drawback of increasing storage density is that the stored data is increasingly prone to being stored and/or read erroneously. An error control coding (ECC) engine is utilized to limit the number of uncorrectable errors that are introduced by electrical fluctuations, defects in the storage medium, operating conditions, device history, and/or write-read circuitry, etc.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to improve decoding of data read from a storage device (e.g., with one or more flash memory devices). In some embodiments, a storage controller is configured to perform operations with/on the storage device (e.g., with one or more flash memory devices). In some embodiments, the storage controller performs a decoding iteration on a soft information codeword and, in accordance with a determination that the decoding result of the decoding iteration fails to satisfy one or more predetermined decoding criteria, performs a soft information adjustment process on the soft information codeword.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIG. 4A is a transition probability table that may be associated with either a single-level memory cell or a single-page read of a multi-level memory cell, in accordance with some embodiments.

FIG. 4B is a schematic diagram of an implementation of a characterization vector that may be produced from the transition probability table of FIG. 4A, in accordance with some embodiments.

FIG. 5A is a transition probability table that may be associated with a joint-page read of a multi-level memory cell, in accordance with some embodiments.

FIG. 5B is a schematic diagram of an implementation of a characterization vector that may be produced from the transition probability table of FIG. 5A, in accordance with some embodiments.

Figure 1:
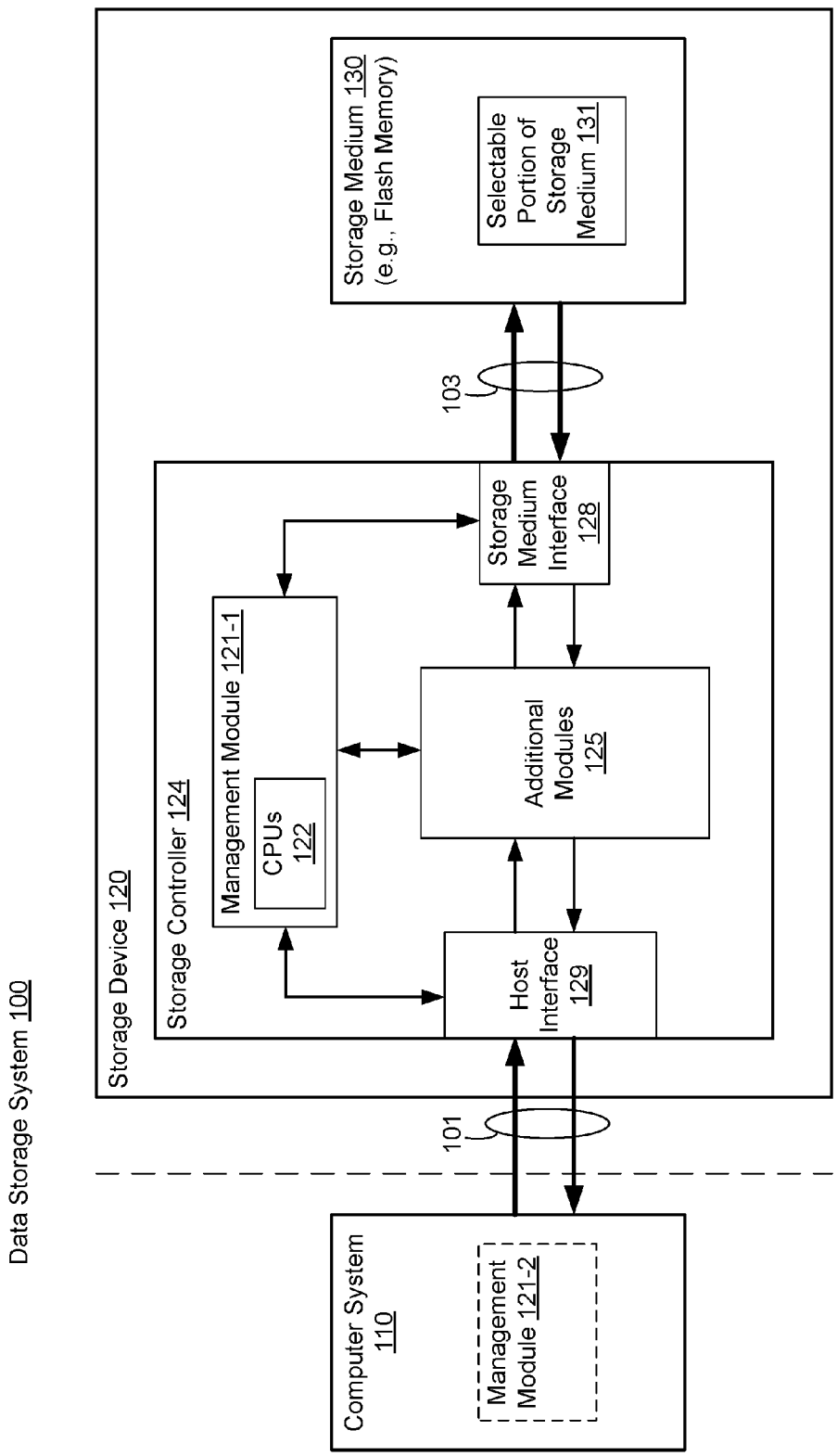
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices that may enhance the performance of error control codes used to improve the reliability with which data can be stored and read in a memory. Some implementations include systems, methods, and/or devices to generate and utilize soft information for decoding error control encoded data read from a storage device (e.g., storage medium 130, FIG. 1) with one or more memory devices (e.g., one or more flash memory devices).

(A1) More specifically, some embodiments include a method of improving decoding of data read from a storage device with one or more memory devices. In some embodiments, the method includes obtaining, in response to a read request, a codeword with two or more codeword portions from the storage device, where the two or more codeword portions at least include a first codeword portion with first raw read data from a first memory portion of the storage device and a second codeword portion with second raw read data from a second memory portion of the storage device distinct from the first memory portion. The method includes performing a first decoding iteration on the codeword. In accordance with a determination that the first decoding iteration fails to satisfy one or more predetermined decoding criteria, the method includes, for the two or more codeword portions of the codeword: (A) determining a count of bit-flips between the raw read data for a respective codeword portion of the two or more codeword portions and a decoding result for the respective codeword portion after the first decoding iteration; (B) determining a soft information offset for the respective codeword portion based on the determined count of bit-flips for the respective codeword portion relative to bit-flips counts for other codeword portions of the codeword; and (C) adjusting soft information for the respective codeword portion based on the determined soft information offset.

(A2) In some embodiments of the method of A1, performing the first decoding iteration on the codeword includes: obtaining soft information for the two or more codeword portions so as to generate a soft information codeword; and performing the first decoding iteration on the soft information codeword.

(A3) In some embodiments of the method of A2, the soft information for the two or more codeword portions is generated based on a look-up table that associates log-likelihood ratio (LLR) values with memory portions of the storage device.

(A4) In some embodiments of the method of A3, the method further includes storing the soft information offset determined after the first decoding iteration, where the soft information offset is associated with an entry in the look-up table for a memory portion in the storage device that corresponds to the respective codeword portion.

(A5) In some embodiments of the method of any of A1 to A4, the first decoding iteration is a first iteration of a low-density parity check (LDPC) decoding process.

(A6) In some embodiments of the method of any of A1 to A5, the first memory portion is located in a first die in the storage device, and the second memory portion is located in a second die in the storage device distinct from the first die.

(A7) In some embodiments of the method of any of A1 to A6, the soft information offset for the respective codeword portion decreases the magnitude of the soft information for the respective codeword portion in accordance with a determination that the count of bit-flips for the respective codeword portion is greater than the bit-flips counts for the other codeword portions of the codeword, and the soft information offset for the respective codeword portion increases the magnitude of the soft information for the respective codeword portion in accordance with a determination that the count of bit-flips for the respective codeword portion is less than the bit-flips counts for the other codeword portions of the codeword.

(A8) In some embodiments of the method of any of A1 to A6, the soft information offset for the respective codeword portion increases the magnitude of the soft information for the respective codeword portion in accordance with a determination that the count of bit-flips for the respective codeword portion is greater than the bit-flips counts for the other codeword portions of the codeword, and the soft information offset for the respective codeword portion decreases the magnitude of the soft information for the respective codeword portion in accordance with a determination that the count of bit-flips for the respective codeword portion is less than the bit-flips counts for the other codeword portions of the codeword.

(A9) In some embodiments of the method of any of A1 to A8, the method further includes after adjusting the soft information for the two or more codeword portions of the codeword, performing a second decoding iteration on the soft information codeword; and, in accordance with a determination that the second decoding iteration fails to satisfy the one or more predetermined decoding criteria, for the two or more codeword portions of the codeword: (A) determining a second count of bit-flips between the raw read data for a respective codeword portion of the two or more codeword portions and a second decoding result for the respective codeword portion after the second decoding iteration; (B) determining a second soft information offset based on the determined second count of bit-flips for the respective codeword portion relative to bit-flips counts for the other codeword portions of the codeword; and (C) adjusting the soft information for the respective codeword portion based on the determined second soft information offset.

(A10) In some embodiments of the method of any of A1 to A9, the storage device comprises one or more flash memory devices.

(A11) In some embodiments of the method of any of A1 to A10, the storage device comprises one or more three-dimensional (3D) memory devices and circuitry associated with operation of memory elements in the one or more 3D memory devices.

(A12) In some embodiments of the method of A11, the circuitry and one or more memory elements in a respective 3D memory device, of the one or more 3D memory devices, are on the same substrate.

(A13) In another aspect, a storage device includes (1) one or more processors, and (2) memory (e.g., non-volatile memory or volatile memory in the storage device) storing one or more programs, which when executed by the one or more processors cause the storage device to perform or control performance of any of the methods A1 to A12 described herein.

(A14) In yet another aspect, any of the methods A1 to A12 described above are performed by a storage device including means for performing or controlling performance of any of the methods described herein.

(A15) In yet another aspect, a storage system includes non-volatile storage for storing information, and a storage controller having one or more processors configured to execute instructions in one or more programs, wherein the storage controller is configured to perform operations that cause the storage system to perform or control performance of any of the methods A1 to A12 described herein.

(A16) In yet another aspect, some embodiments include a non-transitory computer readable storage medium, storing one or more programs configured for execution by one or more processors of a storage device, the one or more programs including instructions for performing or controlling performance of any of the methods A1 to A12 described herein.

FIG. 1 is a block diagram illustrating data storage system 100, in accordance with some embodiments. While some example features are illustrated, various other features have not been illustrated for the sake of brevity and so as not to obscure pertinent aspects of the example embodiments disclosed herein. To that end, as a non-limiting example, data storage system 100 includes a storage device 120, which includes a storage controller 124 and a storage medium 130, and is used in conjunction with or includes a computer system 110. In some embodiments, storage medium 130 is a single flash memory device while in other embodiments storage medium 130 includes a plurality of flash memory devices. In some embodiments, storage medium 130 is NAND-type flash memory or NOR-type flash memory. In some embodiments, storage medium 130 includes one or more three-dimensional (3D) memory devices, as further defined herein. Further, in some embodiments, storage controller 124 is a solid-state drive (SSD) controller. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels or the like. In some embodiments, data storage system 100 can contain one or more storage device 120s.

Computer system 110 is coupled to storage controller 124 through data connections 101. However, in some embodiments computer system 110 includes storage controller 124, or a portion of storage controller 124, as a component and/or a subsystem. For example, in some embodiments, some or all of the functionality of storage controller 124 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch screen display, a mouse, a track-pad, a digital camera, and/or any number of supplemental I/O devices to add functionality. In some embodiments, computer system 110 does not have a display and other user interface components.

Storage medium 130 is coupled to storage controller 124 through connections 103. Connections 103 are sometimes called data connections, but typically convey commands in addition to data, and optionally convey metadata, error correction information and/or other information in addition to data values to be stored in storage medium 130 and data values read from storage medium 130. In some embodiments, however, storage controller 124 and storage medium 130 are included in the same device (i.e., an integrated device) as components thereof. Furthermore, in some embodiments, storage controller 124 and storage medium 130 are embedded in a host device (e.g., computer system 110), such as a mobile device, tablet, other computer or computer controlled device, and the methods described herein are performed, at least in part, by the embedded storage controller. Storage medium 130 may include any number (i.e., one or more) of memory devices including, without limitation, non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally and/or alternatively, flash memory device(s) can also be configured for relatively smaller-scale applications such as personal flash drives or hard-disk replacements for personal, laptop, and tablet computers. In some embodiments, storage medium 130 includes one or more three-dimensional (3D) memory devices, as further defined herein.

Storage medium 130 is divided into a number of addressable and individually selectable blocks, such as selectable portion 131. In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

As noted above, while data storage densities of non-volatile semiconductor memory devices are generally increasing, a drawback of increasing storage density is that the stored data is more prone to being stored and/or read erroneously. In some embodiments, error control coding can be utilized to limit the number of uncorrectable errors that are introduced by electrical fluctuations, defects in the storage medium, operating conditions, device history, write-read circuitry, etc., or a combination of these and various other factors.

In some embodiments, storage controller 124 includes a management module 121-1, a host interface 129, a storage medium (I/O) interface 128, and additional module(s) 125. Storage controller 124 may include various additional features that have not been illustrated for the sake of brevity and so as not to obscure pertinent features of the example embodiments disclosed herein, and a different arrangement of features may be possible. Host interface 129 provides an interface to computer system 110 through data connections 101. Similarly, storage medium interface 128 provides an interface to storage medium 130 though connections 103. In some embodiments, storage medium interface 128 includes read and write circuitry, including circuitry capable of providing reading signals to storage medium 130 (e.g., reading threshold voltages for NAND-type flash memory).

Figure 3A:
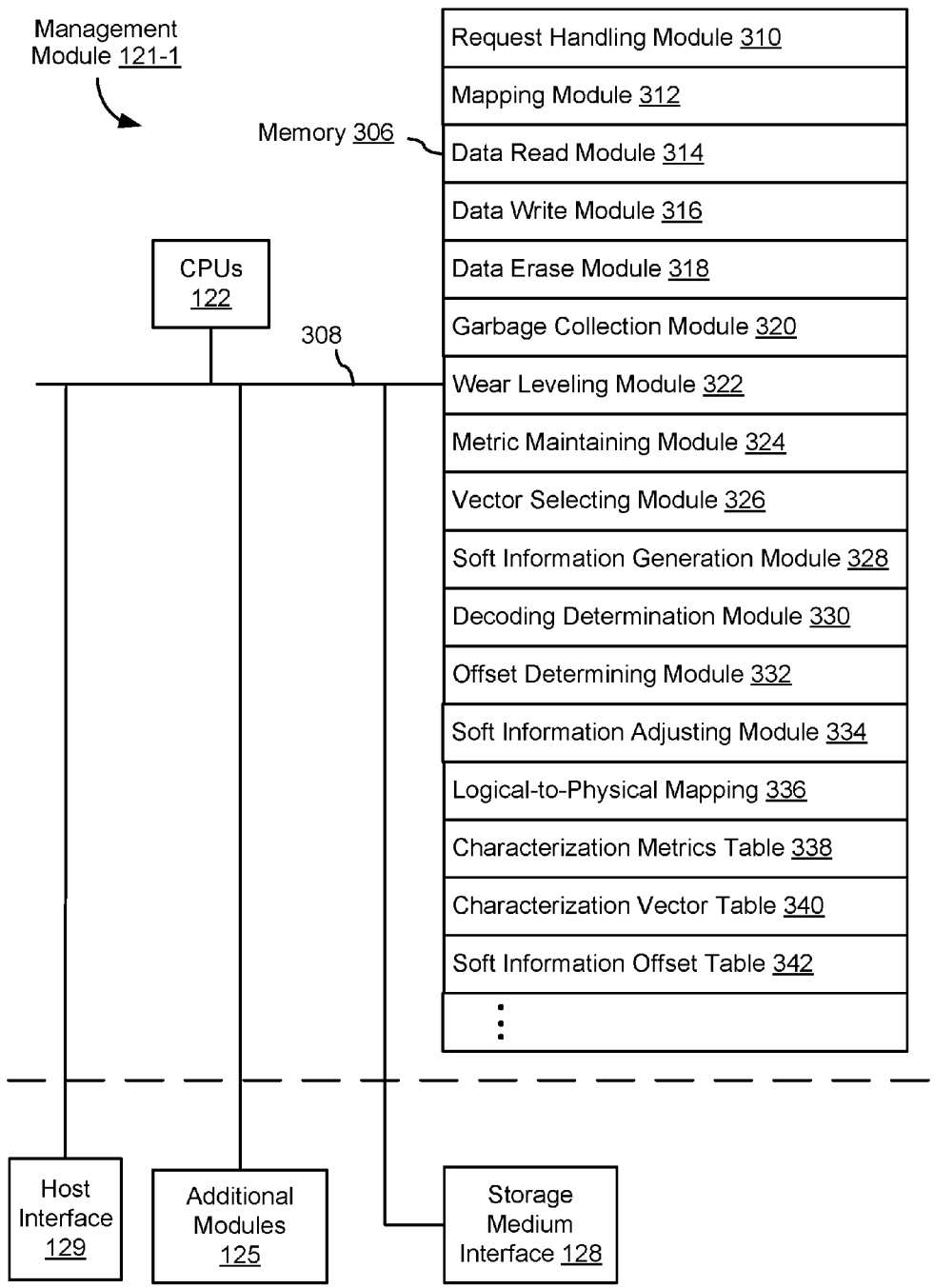
FIG. 3A is a block diagram of an implementation of a management module, in accordance with some embodiments.

In some embodiments, as shown in FIG. 3A, management module 121-1 includes one or more processing units (CPUs, also sometimes called processors) 122 configured to execute instructions in one or more programs (e.g., in management module 121-1). In some embodiments, the one or more CPUs 122 are shared by one or more components within, and in some cases, beyond the function of storage controller 124. Management module 121-1 is coupled to host interface 129, additional module(s) 125 and storage medium interface 128 in order to coordinate the operation of these components. In some embodiments, one or more modules of management module 121-1 are implemented in management module 121-2 of computer system 110. In some embodiments, one or more processors of computer system 110 (not shown) are configured to execute instructions in one or more programs (e.g., in management module 121-2). Management module 121-2 is coupled to storage device 120 in order to manage the operation of storage device 120.

Additional module(s) 125 are coupled to storage medium interface 128, host interface 129, and management module 121-1. As an example, additional module(s) 125 may include an error control module to limit the number of uncorrectable errors inadvertently introduced into data during writes to memory and/or reads from memory. In some embodiments, additional module(s) 125 are executed in software by the one or more CPUs 122 of management module 121-1, and, in other embodiments, additional module(s) 125 are implemented in whole or in part using special purpose circuitry (e.g., to perform encoding and decoding functions). In some embodiments, additional module(s) 125 are implemented in whole or in part by software executed on computer system 110.

In some embodiments, an error control module, included in additional module(s) 125, includes an encoder and a decoder. In some embodiments, the encoder encodes data by applying an error control code (ECC) to produce a codeword, which is subsequently stored in storage medium 130. When encoded data (e.g., one or more codewords) is read from storage medium 130, the decoder applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

In some embodiments, during a write operation, host interface 129 receives data to be stored in storage medium 130 from computer system 110. The data received by host interface 129 is made available to an encoder (e.g., in additional module(s) 125), which encodes the data to produce one or more codewords. The one or more codewords are made available to storage medium interface 128, which transfers the one or more codewords to storage medium 130 in a manner dependent on the type of storage medium being utilized.

In some embodiments, a read operation is initiated when computer system (host) 110 sends one or more host read commands (e.g., via data connections 101, or alternatively a separate control line or bus) to storage controller 124 requesting data from storage medium 130. Storage controller 124 sends one or more read access commands to storage medium 130, via storage medium interface 128, to obtain raw read data in accordance with memory locations (addresses) specified by the one or more host read commands. Storage medium interface 128 provides the raw read data (e.g., comprising one or more codewords) to a decoder (e.g., in additional module(s) 125). If the decoding is successful, the decoded data is provided to host interface 129, where the decoded data is made available to computer system 110. In some embodiments, if the decoding is not successful, storage controller 124 may resort to a number of remedial actions or provide an indication of an irresolvable error condition.

As explained above, a storage medium (e.g., storage medium 130) is divided into a number of addressable and individually selectable blocks and each block is optionally (but typically) further divided into a plurality of pages and/or word lines and/or sectors. While erasure of a storage medium is performed on a block basis, in many embodiments, reading and programming of the storage medium is performed on a smaller subunit of a block (e.g., on a page basis, word line basis, or sector basis). In some embodiments, the smaller subunit of a block consists of multiple memory cells (e.g., single-level cells or multi-level cells). In some embodiments, programming is performed on an entire page. In some embodiments, a multi-level cell (MLC) NAND flash typically has four possible states per cell, yielding two bits of information per cell. Further, in some embodiments, a MLC NAND has two page types: (1) a lower page (sometimes called fast page), and (2) an upper page (sometimes called slow page). In some embodiments, a triple-level cell (TLC) NAND flash has eight possible states per cell, yielding three bits of information per cell. Although the description herein uses TLC, MLC, and SLC as examples, those skilled in the art will appreciate that the embodiments described herein may be extended to memory cells that have more than eight possible states per cell, yielding more than three bits of information per cell. The encoding format of the storage media (e.g., TLC, MLC, or SLC and/or a chosen data redundancy mechanism) is implemented by encoding data when data is actually written to the storage media.

As an example, if data is written to a storage medium in pages, but the storage medium is erased in blocks, pages in the storage medium may contain invalid (e.g., stale) data, but those pages cannot be overwritten until the whole block containing those pages is erased. In order to write to the pages with invalid data, the pages (if any) with valid data in that block are read and re-written to a new block and the old block is erased (or put on a queue for erasing). This process is called garbage collection. After garbage collection, the new block contains the pages with valid data and may have free pages that are available for new data to be written, and the old block can be erased so as to be available for new data to be written. Since flash memory can only be programmed and erased a limited number of times, the efficiency of the algorithm used to pick the next block(s) to re-write and erase has a significant impact on the lifetime and reliability of flash-based storage systems.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1" and otherwise the raw data value is a "0."

As discussed below with reference to FIG. 2A, a single-level flash memory cell (SLC) stores one bit ("0" or "1"). Thus, the storage density of an SLC memory device is one bit of information per memory cell. A multi-level flash memory cell (MLC), however, can store two or more bits of information per cell by using different ranges within the total voltage range of the memory cell to represent a multi-bit bit-tuple. In turn, the storage density of an MLC memory device is multiple-bits per cell (e.g., two bits per memory cell). One of ordinary skill in the art will appreciate how to apply the below discussion of 1-bit SLC and 2-bit MLC to N-bit memory cells.

Figure 2A:
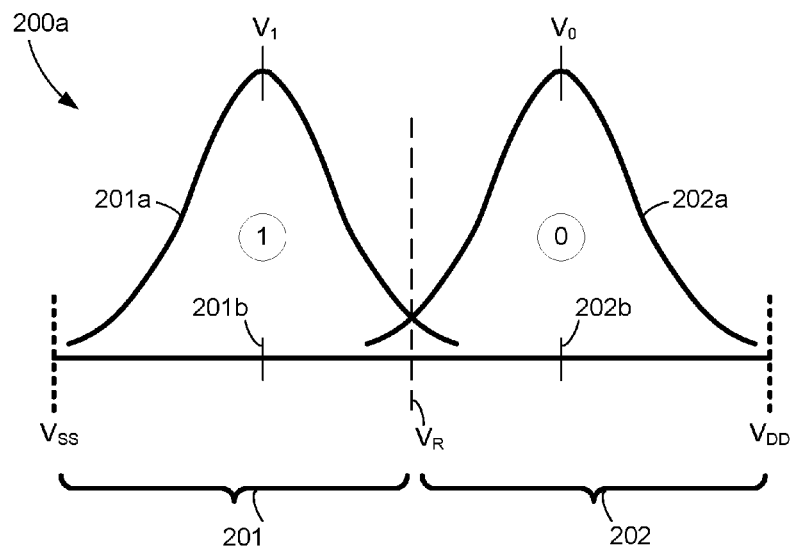
FIG. 2A is a prophetic diagram of voltage distributions that may be found in a single-level flash memory cell (SLC) over time, in accordance with some embodiments.

FIG. 2A is a simplified, prophetic diagram of voltage distributions 200a found in a single-level flash memory cell (SLC) over time. The voltage distributions 200a shown in FIG. 2A have been simplified for illustrative purposes. In this example, the SLC's voltage range extends approximately from a voltage, VSS, at a source terminal of an NMOS transistor to a voltage, $V_{DD}$, at a drain terminal of the NMOS transistor. As such, voltage distributions 200a extend between $V_{SS}$ and $V_{DD}$.

Sequential voltage ranges 201 and 202 between source voltage $V_{SS}$ and drain voltage $V_{DD}$ are used to represent corresponding bit values "1" and "0," respectively. Each voltage range 201, 202 has a respective center voltage $V_1$ 201b, $V_0$ 202b. As described above, in many circumstances the memory cell current sensed in response to an applied reading threshold voltages is indicative of a memory cell voltage different from the respective center voltage $V_1$ 201b or $V_0$ 202b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 201, 202 also has a respective voltage distribution 201a, 202a that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 201b and $V_0$ 202b). Optionally, in some implementations, the reading threshold voltage is located between voltage ranges 201 and 202. In some implementations, reading threshold voltage $V_R$ is applied in the region proximate to where the voltage distributions 201a and 202a overlap, which is not necessarily proximate to the halfway region between adjacent center voltages $V_1$ 201b and $V_0$ 202b.

In order to increase storage density in flash memory, flash memory has developed from single-level (SLC) cell flash memory to multi-level cell (MLC) flash memory so that two or more bits can be stored by each memory cell. As discussed below with reference to FIG. 2B, an MLC flash memory device is used to store multiple bits by using voltage ranges within the total voltage range of the memory cell to represent different bit-tuples. An MLC flash memory cell is typically more error prone than an SLC flash memory device created using the same manufacturing process because the effective voltage difference between the voltages used to store different data values is smaller for an MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below with reference to FIG. 2B, the impact of such errors can be reduced by gray-coding the data, such that adjacent voltage ranges represent single-bit changes between bit-tuples.

Figure 2B:
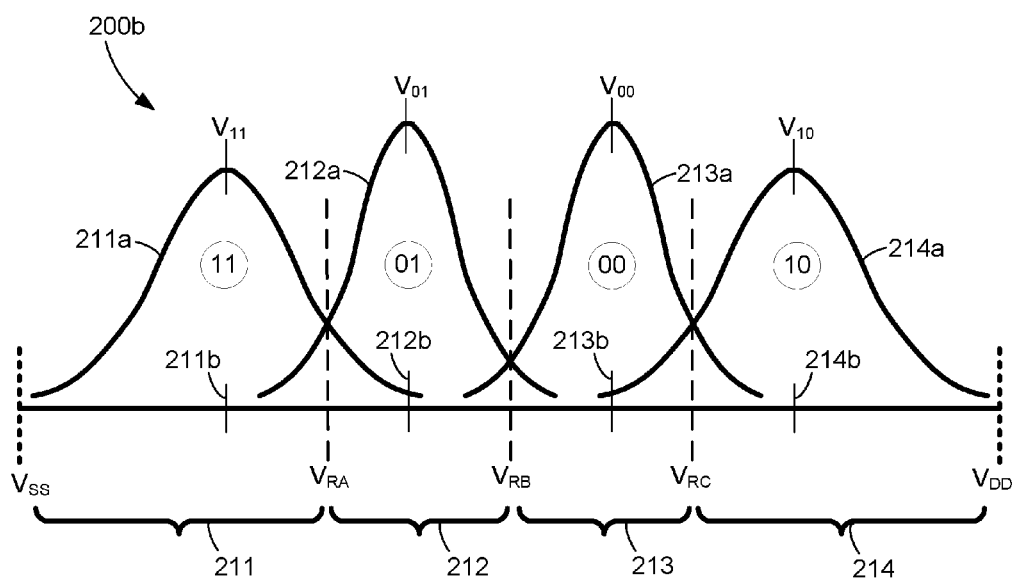
FIG. 2B is a prophetic diagram of voltage distributions that may be found in a multi-level flash memory cell (MLC) over time, in accordance with some embodiments.

FIG. 2B is a simplified, prophetic diagram of voltage distributions 200b that may be found in a multi-level flash memory cell (MLC) over time. The voltage distributions 200b shown in FIG. 2B have been simplified for illustrative purposes. The cell voltage of an MLC approximately extends from a voltage, $V_{SS}$, at the source terminal of a NMOS transistor to a voltage, $V_{DD}$, at the drain terminal. As such, voltage distributions 200b extend between $V_{SS}$ and $V_{DD}$.

Sequential voltage ranges 211, 212, 213, 214 between the source voltage $V_{SS}$ and drain voltages $V_{DD}$ are used to represent corresponding bit-tuples "11," "01," "00," "10," respectively. Each voltage range 211, 212, 213, 214 has a respective center voltage 211b, 212b, 213b, 214b. Each voltage range 211, 212, 213, 214 also has a respective voltage distribution 211a, 212a, 213a, 214a that may occur as a result of any number of a combination of factors, such as electrical fluctuations, defects in the storage medium, operating conditions, device history (e.g., number of program-erase (PE) cycles), and/or imperfect performance or design of write-read circuitry.

Ideally, during a write operation, the charge on the floating gate of the MLC would be set such that the resultant cell voltage is at the center of one of the ranges 211, 212, 213, 214 in order to write the corresponding bit-tuple to the MLC. Specifically, the resultant cell voltage would be set to one of $V_{11}$ 211b, $V_{10}$ 212b, $V_{00}$ 213b and $V_{10}$ 214b in order to write a corresponding one of the bit-tuples "11," "01," "00" and "10." In reality, due to the factors mentioned above, the initial cell voltage may differ from the center voltage for the data written to the MLC.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 211, 212, 213, 214. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 211b, $V_{10}$ 212b, $V_{00}$ 213b or $V_{10}$ 214b corresponding to the data value written into the cell. For example, the actual cell voltage may be in an altogether different voltage range, strongly indicating that the MLC is storing a different bit-tuple than was written to the MLC.

More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

One way to reduce the impact of a cell voltage drifting from one voltage range to an adjacent voltage range is to gray-code the bit-tuples. Gray-coding the bit-tuples includes constraining the assignment of bit-tuples such that a respective bit-tuple of a particular voltage range is different from a respective bit-tuple of an adjacent voltage range by only one bit. For example, as shown in FIG. 2B, the corresponding bit-tuples for adjacent ranges 201 and 202 are respectively "11" and "01," the corresponding bit-tuples for adjacent ranges 202 and 203 are respectively "01" and "00," and the corresponding bit-tuples for adjacent ranges 203 and 204 are respectively "00" and "10." Using gray-coding, if the cell voltage drifts close to a read comparison voltage level, the error is typically limited to a single bit within the 2-bit bit-tuple.

FIG. 3A is a block diagram illustrating a management module 121-1, in accordance with some embodiments, as shown in FIG. 1. Management module 121-1 typically includes one or more processing units (sometimes called CPUs or processors) 122 for executing modules, programs, and/or instructions stored in memory 306 and thereby performing processing operations, memory 306 (sometimes called controller memory), and one or more communication buses 308 for interconnecting these components. The one or more communication buses 308 optionally include circuitry (sometimes called a chipset) that interconnects and controls communications between system components. Management module 121-1 is coupled to host interface 129, additional module(s) 125, and storage medium interface 128 by the one or more communication buses 308. Memory 306 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 306 optionally includes one or more storage devices remotely located from CPU(s) 122. Memory 306, or alternatively the non-volatile memory device(s) within memory 306, comprises a non-transitory computer readable storage medium. In some embodiments, memory 306, or the non-transitory computer readable storage medium of memory 306 stores the following programs, modules, and data structures, or a subset or superset thereof:

request handling module 310 for receiving input/output (I/O) requests from a host (e.g., write requests and/or read requests);

mapping module 312 for mapping logical addresses to physical addresses using logical-to-physical mapping 336;

data read module 314 data for reading data, or causing data to be read, from storage medium 130 (FIG. 1);

data write module 316 writing data, or causing data to be written, to storage medium 130 (FIG. 1);

data erase module 318 for erasing data, or causing data to be erased, from storage medium 130 (FIG. 1);

garbage collection module 320 for performing a garbage collection process on one or more memory portions (i.e., blocks) of storage medium 130 (FIG. 1);

wear leveling module 322 for determining or selecting memory portions (i.e., pages or blocks) of storage medium 130 (FIG. 1) for storing data so as to evenly wear the memory portions of storage medium 130 (FIG. 1);

metric maintaining module 324 for maintaining one or more characterization metrics for each memory portion (e.g., a memory device, die, block, word line zone, word line, or page portion) of storage medium 130 (FIG. 1) or a combined status metric for each memory portion of storage medium 130 (FIG. 1) in characterization metrics table 338, where the combined status metric for a respective memory portion is computed based on a predefined algorithm that includes the one or more characterization metrics corresponding to the respective memory portion;

vector selecting module 326 for identifying one or more characterization entries in characterization metrics table 338 that corresponds to one or more physical addresses determined by mapping module 312 for a read request and for identifying one or more characterization vectors in characterization vector table 340 with storage medium characterization parameters that match characterization metrics in the one or more identified characterization entries;

soft information generation module 328 for generating soft information (i.e., one or more soft information codewords) based on raw read data (i.e., one or more codewords) and LLR values included in the one or more characterization vectors selected by vector selecting module 326;

decoding determination module 330 for determining whether the decoding result of a decoding iteration satisfies one or more predetermined decoding criteria;

offset determining module 332 for, in accordance with a determination by decoding determination module 330 that the decoding result does not satisfy the one or more predetermined decoding criteria, determining a soft information offset (e.g., an offset read from or based on soft information offset table 342);

soft information adjusting module 334 for adjusting the soft information (sometimes called soft information codewords) generated by soft information generation module 328 based on the soft information offset determined by offset determining module 332;

logical-to-physical mapping 336 storing a logical-to-physical map which maps logical addresses recognized by the host (e.g., computer system 110, FIG. 1) to physical addresses of storage medium 130 (FIG. 1);

characterization metrics table 338 storing characterization entries for memory portions (e.g., die, block, word line zone, word line, page, etc.) of storage medium 130 (FIG. 1);

characterization vector table 340 storing a collection of characterization vectors 345 (FIG. 3C) that store characterization data (e.g., reading threshold voltages and LLR values) corresponding to different sets of storage medium characterization parameter values; and soft information offset table 342 storing predetermined soft information offsets.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 306 may store a subset of the modules and data structures identified above. Furthermore, memory 306 may store additional modules and data structures not described above. In some embodiments, the programs, modules, and data structures stored in memory 306, or the non-transitory computer readable storage medium of memory 306, provide instructions for implementing some of the methods described below. In some embodiments, some or all of these modules may be implemented with specialized hardware circuits that subsume part or all of the module functionality.

Although FIG. 3A shows a management module 121-1, FIG. 3A is intended more as functional description of the various features which may be present in a management module than as a structural schematic of the embodiments described herein. In practice, and as recognized by those of ordinary skill in the art, items shown separately could be combined and some items could be separated. In some embodiments, one or more of the operations and/or modules of management module 121-1 may instead be performed and/or implemented by management module 121-2.

Figure 3B:
FIG. 3B is a diagram of a characterization metrics table included in FIG. 3A, in accordance with some embodiments.

FIG. 3B is a block diagram of a characterization metrics table 338, in accordance with some embodiments. Characterization metrics table 338 includes a characterization entry 343 for each memory portion (e.g., die, block, word line zone, etc.) of storage medium 130. In this example, characterization entry 343-A for a respective memory portion includes: the physical address or set of physical addresses 362 corresponding to the respective memory portion, characterization metrics 364 corresponding to the respective memory portion, ECC type 378 corresponding to the current ECC scheme (e.g., Reed-Solomon, Bose-Chaudhuri-Hocquenghem, Turbo, Low-Density Parity Check, etc.) of data stored in the respective memory portion (if any), storage density 380 corresponding to the current storage density (e.g., SLC, MLC, or TLC) of memory cells in the respective memory portion, and, optionally, other information 382 associated with the respective memory portion such as previously used reading threshold voltages, previously used LLR values, a previously determined soft information offset, and the like.

In some embodiments, characterization metrics 364 include two or more values, such as two or more of: a word line position 366 corresponding to the respective memory portion, a count of bytes written 368 to the respective memory portion, a count of program/erase (PE) cycles 370 performed on the respective memory portion, a bit error rate (BER) 372 for codewords recently read from the respective memory portion, and other intrinsic or extrinsic usage information 374 such as the average operating temperature, maximum operating temperature, and the like. In some embodiments, characterization metrics 364 optionally include a combined status metric 376 for the respective memory portion computed based on a predefined algorithm that includes the one or more characterization metrics corresponding to the respective memory portion (e.g., characterization metrics 366, 368, 370, 372, and 374). In some embodiments, the characterization entries 343 of a characterization metrics table 338 includes a subset of the fields listed above, and optionally includes additional information not listed above.

Figure 3C:
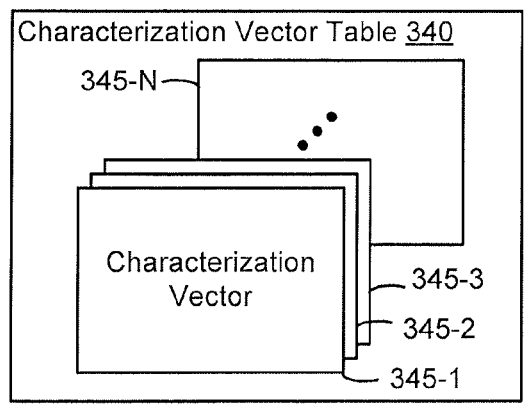
FIG. 3C is a diagram of a characterization vector table included in FIG. 3A, in accordance with some embodiments.

FIG. 3C is a block diagram of a characterization vector table 340, in accordance with some embodiments. Characterization vector table 340 includes a collection of characterization vectors 345-1, 345-2, 345-3, . . . 345-N, that each store characterization data, such as soft information values for bit-tuples and reading threshold voltages, associated with storage medium 130 for one or more storage medium characterization parameter values. In some implementations, the characterization data stored in characterization vectors 345 is statistically derived. More detailed example implementations of characterization vectors 345 are described below with reference to FIGS. 4A-4B and 5A-5B.

Figure 3D:
FIGS. 3D and 3E are diagrams depicting examples a soft information offset tables, in accordance with some embodiments.

FIG. 3D is a block diagram of an example soft information offset table 342, in accordance with some embodiments. In some embodiments, soft information offset table 342 stores predetermined soft information offsets. For example, the values in columns 384 and 386 are determined based on test data for the type, batch, lot, manufacturer, and/or other identifiers for the memory devices that comprise storage medium 130. In some embodiments, soft information offset table 342 provides soft information offsets in columns 384 and 386 based on the difference between bit-flips, in column 382, after decoding for a first set of codeword portions (i.e., set A) relative to a second set of codeword portions (i.e., set B). For example, if the difference is +10 (i.e., 10 more bit-flips associated with set A of codeword portions versus set B of codeword portions), the soft information offset for codeword portions corresponding to set A will be 1 and the soft information offset for codeword portions corresponding to set B will be −1. One of skill in the art will appreciate that the values shown in soft information offset table 342 in FIG. 3D are examples and that other values may be used in practice.

Figure 3E:

Furthermore, one of skill in the art will appreciate that soft information offset table 342 may be expanded or changed to provide soft information offsets for more than two sets of codeword portions. For example, FIG. 3E is a block diagram of an example soft information offset table 342-A, in accordance with some embodiments in which there are more than two sets of codeword portions. In some embodiments, soft information offset table 342-A provides soft information offsets in column 388 based on based on the difference between bit-flips, in column 387, between any one set of codeword portions (e.g., set A, set B or set C) relative to the average number of bit-flips (BFA) in all the sets of codeword portions (e.g., the sum of the numbers of bit-flips in sets A, B and C, divided by 3). For example, if the difference is +10 (i.e., 10 more bit-flips associated with set A of codeword portions versus the BFA), the soft information offset for codeword portions corresponding to set A will be 1, whereas if the difference is −10, the soft information offset for codeword portions corresponding to set A will be −1. One of skill in the art will appreciate that the values shown in soft information offset table 342-A in FIG. 3E are examples and that other values may be used in practice.

Soft information generation module 328 is configured to generate a sequence of soft information values corresponding to raw read data read from storage medium 130 (e.g., hard-decision data). The sequence of soft information values is generated, at least in part, by selecting a respective soft information value from a selected characterization vector for each bit-tuple of the raw read data. More specifically, in some implementations, information generation module 328 assigns at least one soft information value, in the form of a log-likelihood ratio (LLR), to each bit-tuple in the hard-decision read data from the read operation to produce a sequence of LLRs $y_{LLR}=(y_0, y_1, \ldots, y_{n-1})$, where n is the codeword length.

In some implementations, LLRs can be generated from transition probabilities. To that end, a basis for a characterization process may be established as follows. Let X be the set of $Q=2^q$ levels on which a q-bit bit-tuple is written to a flash memory cell, where each of the q-bits is from a respective page of the q-pages of data stored in the flash memory cells. For example, when q=2, X={11,01,00,10}. Let Y be the set of Q levels that a q-bit bit-tuple is read out from the flash memory cell based on reading threshold voltages, such as $V_{RA}$, $V_{RB}$, and $V_{RC}$ described above with reference to FIG. 2B. Due to pseudo-random fluctuations, defects in the storage medium, operating conditions, device history, and/or write-read circuitry, etc., the read out voltage level from a flash memory cell y∈Y may be different from the written voltage level x∈X. The set of actual voltages for each level in memory cell typically has a distribution or set of possible values, as described above with reference to FIG. 2B. The voltage distributions are affected by factors such as page location, page type, program/erase (PE) cycles, data mode (operation, retention), temperature, etc. In some implementations, the voltage distribution and the variation of the voltage distribution may be used to generate soft information values, such as transition probabilities and/or LLRs, based on a device characterization process.

The following describes an example in which q=2 (i.e., 2 bits per cell in an MLC flash memory). However, those skilled in the art will appreciate from the present disclosure that the 2-bit implementation may be extended to other types of MLC flash memory that more bits (q≥3) per memory cell.

Each combination of storage medium characterization parameter values represents a respective state of a storage medium (e.g., a flash memory device) that may be characterized in a device characterization process, and may exist for other devices produced by the same manufacturing process.

With respect to MLC flash memory (e.g., storage media 130, FIG. 1), there are generally two types of read operations that may be performed on MLC flash memory that result in disjoint sets of transition probabilities. One is a single-page read, which includes reading the respective bits of a particular page from a number of q-page MLC flash memory cells. For example, for a 2-page flash memory, the two constituent pages are referred to as the lower page and the upper page, where the lower page bit is typically the least significant bit of the 2-bit bit-tuple, and the upper page is the most significant bit. For the single-page read scenario, one of the upper page and lower page bit from a number of MLC flash memory cells is read. Thus, a lower-page read delivers a sequence of respective lower-page bits from a number of 2-page MLC flash memory cells. The other type of read is a joint-page read, which generally includes reading the respective bits of two or more pages from a number of q-page MLC flash memory cells. So, for a 2-page (i.e., q=2) flash memory, a joint-page read delivers a sequence of respective 2-bit bit-tuples from a number of 2-page MLC flash memory cells. For each type of read, and a combination of storage medium characterization parameter values, one or more transition probabilities tables is generated by comparing write data and read data.

FIG. 4A, for example, is a transition probability table 400 associated with either an SLC flash memory cell or a single-page read of an MLC flash memory cell for a particular combination of storage medium characterization parameter values. The transition probability values $p_{00}$, $p_{10}$, $p_{01}$, $p_{11}$ in transition probability table 400 are determined for a single-page read of an MLC flash memory cell as follows. Let $x_b$ be the data bit written to a lower page and $y_b$ be the voltage level range read from the same lower page. Each transition probability $p_{00}$, $p_{10}$, $p_{01}$, $p_{11}$ is determined as a conditional probability $p_{i,j}=p(y_b=V_j|x_b=i)$ that a particular voltage level range $y_b=V_j$ is read when the bit $x_b=i$ was written. For example, the transition probability $p_{00}$ is the probability that a voltage level range $V_0$ was read given a bit "0" was written, and the transition probability $p_{01}$ is the probability that a voltage level range $V_1$ was read given that a bit "0" was written, etc. Moreover, the transition probabilities, and subsequently the LLRs, generated for the single-page read correspond to bit-tuples each including a single bit even though the MLC flash memory cell stores a bit-tuple including two or more bits. Those skilled in the art will appreciate from the present disclosure that the transition probability table for the upper page is similarly obtained by writing and reading upper page data for a combination of storage medium characterization parameter values. Those skilled in the art will also appreciate from the present disclosure that for each of the possible write bit values, the transition probabilities satisfy equation (1):

$$\Sigma_{j=0}^{2q-1}(p_{ij})=1 \qquad (1).$$

Once the transition probabilities have been generated for a combination of storage medium characterization parameter values, corresponding LLRs may be generated and stored in a collection of characterization vectors. In some implementations, the transition probabilities are stored in a collection of characterization vectors instead of, or in addition to, the LLRs. However, LLRs provide a more compact representation of the soft information provided by the transition probabilities.

FIG. 5A is a transition probability table 500 associated with a joint-page read of an MLC flash memory cell. Again, a joint-page read generally includes reading the respective bits of two or more pages from a number of q-page MLC flash memory cells. Consequently, the sequence of read data includes multi-bit bit-tuples, and the transition probabilities and LLRs generated for a joint-page read correspond to bit-tuples each including two or more bits. Accordingly, for a 2-page MLC flash memory the bits for both the upper page and lower page are read together (e.g., by determining the voltage level produced by a 2-bit flash memory cell during a read operation). Again, the characterization process includes comparing the read out voltage level range y∈Y with the written data x∈X, and the transition probability $p_{i,j}=p(y=j|x=i)$ is the conditional probability of read out voltage level range y=j given the written data x=i. Additionally, for the joint-page read the written data and read voltage level ranges {11,01,00,10} are mapped to a respective index {3,1,0,2} in the table. Thus, for example, the transition probability $p_{13}$ is the probability that voltage level range $V_{11}$ (or $V_3$) is read (i.e., that a memory cell voltage in the voltage level range associated with a "3" is read) when a "1" (or "01") was written. Further, as described above, for each data value written to the MLC flash memory cell, the transition probabilities satisfy equation (1).

In some implementations, LLRs for a combination of storage medium characterization parameter values may be generated using equation (2) as follows:

$$LLR(y_k) \equiv \log\left(\frac{P(x_k=0|y)}{P(x_k=1|y)}\right). \qquad (2)$$

In equation (2), $y_k$ represents the k-th bit read from a q-bit multi-level memory cell, which corresponds to a read out voltage level range y∈Y for 0≤k<q. Equation (2) can be rewritten as (3), in which $X_k^{(0)}$ denotes the subset of the written bits X where the k-th bit is 0, $X_k^{(1)}$ denotes the subset of the written bits X where the k-th bit is 1, and $X_k^{(0)} \cup X_k^{(1)} = X$.

$$LLR(y_k) = \log\left(\frac{\sum_{\alpha \in X_k^{(0)}} P(y \mid x = \alpha)}{\sum_{\alpha \in X_k^{(1)}} P(y \mid x = \alpha)}\right) \quad (3)$$

For a single-page read, equation (3) simplifies to equations (5) and (6):

$$LLR(V_0) = \log\left(\frac{P(y_b = V_0 \mid x_b = 0)}{P(y_b = V_0 \mid x_b = 1)}\right) = \log\left(\frac{p_{00}}{p_{10}}\right) \quad (4)$$

$$LLR(V_1) = \log\left(\frac{P(y_b = V_1 \mid x_b = 0)}{P(y_b = V_1 \mid x_b = 1)}\right) = \log\left(\frac{p_{01}}{p_{11}}\right) \quad (5)$$

For a joint-page read, equation (3) does not simplify as concisely as above for $y_b = V_0$ and $y_b = V_1$. However, as an example for $y = V_{11}$, equation (3) may be written as:

$$LLR(V_{11}, \text{upper page}) = \log\left(\frac{P(y = V_{11} \mid x = 00) + P(y = V_{11} \mid x = 10)}{P(y = V_{11} \mid x = 11) + P(y = V_{11} \mid x = 01)}\right) \quad (6)$$

$$LLR(V_{11}, \text{lower page}) = \log\left(\frac{P(y = V_{11} \mid x = 01) + P(y = V_{11} \mid x = 00)}{P(y = V_{11} \mid x = 11) + P(y = V_{11} \mid x = 10)}\right) \quad (7)$$

Those skilled in the art will appreciate from the present disclosure, and in particular equations (3), (6) and (7), how to obtain the LLRs for $y = V_{01}$, $V_{00}$, and $V_{10}$.

FIG. 4B is a schematic diagram of an implementation of a characterization vector 402, in accordance with some embodiments. In some embodiments, characterization vector 402 corresponds to any one of the characterization vectors 345 shown in FIG. 3C. In some embodiments, characterization vector 402 includes soft information values 432, 433 produced from transition probability values in table 400 of FIG. 4A. In some embodiments, characterization vector 402 includes a storage medium characterization parameters field 410, a reading threshold voltages field 420, and a single-page read LLR values field 430. With further reference to FIG. 3C, in some implementations, a characterization vector is a data structure that facilitates reading raw data values from a storage medium. In some implementations, respective transition probability values (e.g., based on transition probability table 400) and/or LLR values (e.g., $LLR(y_b = V_0)$ and $LLR(y_b = V_1)$) for a single-page read and/or a joint-page read are stored in a respective characterization vector for a combination of storage medium characterization parameter values for a portion of a storage medium.

Storage medium characterization parameters field 410 is provided to store one or more storage medium characterization parameter values. For example, the storage medium characterization parameters field 410 includes a combined status metric field 411, a temperature field 412, a program-erase (PE) cycles field 413, and a word line position field 414. However, those skilled in the art will appreciate from the present disclosure that any number of storage medium characterization parameter values (e.g., those discussed above) may be included in the storage medium characterization parameters field 410. The storage medium characterization parameter values in field 410 correspond to a state of a portion of the storage medium for which the characterization data in characterization vector 402 is applicable. As such, in some implementations, a collection of characterization vectors may be indexed, and thus made searchable and selectable, by one or more storage medium characterization parameter values stored in the respective fields.

In some implementations, characterization vector 402 does not include storage medium characterization parameters field 410, and instead the storage medium characterization parameter values corresponding to characterization vector 402 are implied by the location of characterization vector 402 in a table or database of characterization vectors. For example, if there are three storage medium characterization parameters (a, b, and c), having, 3, 4, and 5 potential values, respectively, there will a set of 60 (i.e., 3×4×5) distinct characterization vectors for 60 distinct states of the storage medium. Any one of the 60 characterization vectors is accessed by forming an index from the three storage medium characterization parameters (a, b, and c) corresponding to the current state of the storage medium, and reading or otherwise obtaining the characterization vector corresponding to that index.

Reading threshold voltage(s) field 420 is provided to store one or more reading threshold voltages applicable to a respective state of a storage medium characterized by the one or more storage medium characterization parameter values used to define characterization vector 402. In some embodiments, reading threshold voltage(s) field 420 includes $V_{RA}$ 421a, $V_{RB}$ 421b, and $V_{RC}$ 421c. For example, if $V_{RA}$ 421a, $V_{RB}$ 421b, and $V_{RC}$ 421c were determined at time T−1, then during a subsequent read operation at time T one or more of $V_{RA}$ 421a, $V_{RB}$ 421b, and $V_{RC}$ 421c is used to read a corresponding portion of the storage medium. Single-page read LLR values field 430 stores lower page LLR values 432 and upper page LLR values 433 for respective lower and upper page reads, which are indexed by read data values 431 (e.g., "0" and "1").

FIG. 5B is a schematic diagram of an implementation of a characterization vector 502, in accordance with some embodiments. In some embodiments, characterization vector 502 corresponds to any one of the characterization vectors 345 shown in FIG. 3C. In some embodiments, characterization vector 502 includes soft information values 532, 533 produced from the transition probability values in table 500 of FIG. 5A. The characterization vector 502 illustrated in FIG. 5B is similar to characterization vector 402 illustrated in FIG. 4B. Elements common to both characterization vectors have been assigned the same reference numbers, and only the differences between the characterization vectors 402 and 502 are described herein for the sake of brevity. Moreover, while certain specific features are illustrated, those skilled in the art will appreciate from the present disclosure that various other features have not been illustrated for the sake of brevity and so as not to obscure more pertinent aspects of the example implementations disclosed herein. As compared to characterization vector 402, characterization vector 502 includes a joint-page read LLR value field 530 that stores lower page LLR values 532 and upper page LLR values 533 for respective lower and upper page reads, which are indexed by read data values 531.

Figure 6A:
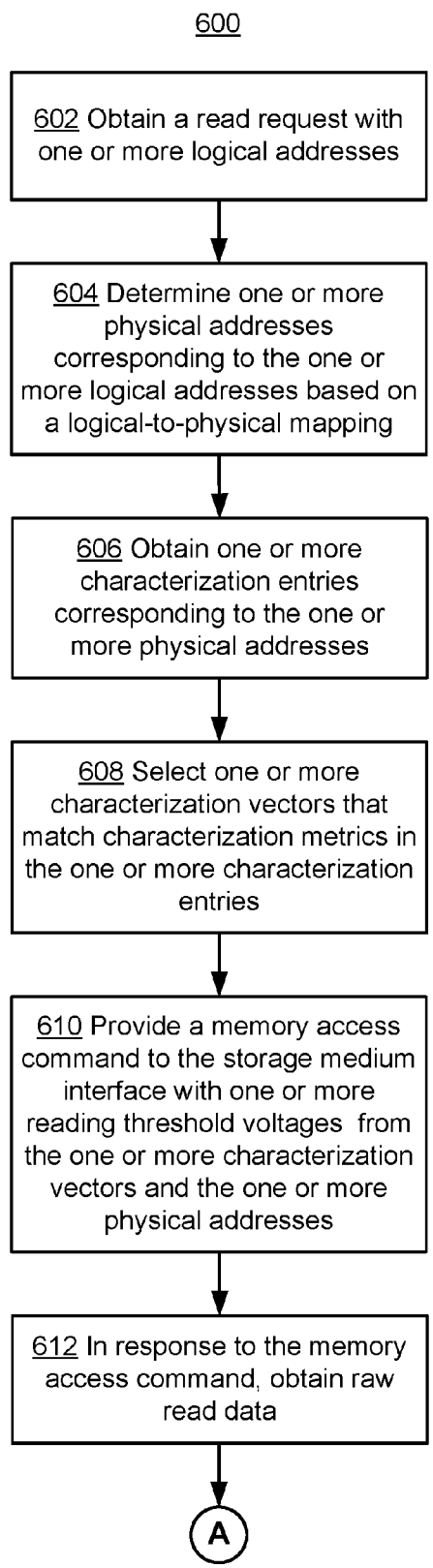
FIGS. 6A-6B illustrate a flow diagram of process for improving decoding of data read from a storage device with one or more memory devices, in accordance with some embodiments.
Figure 6B:
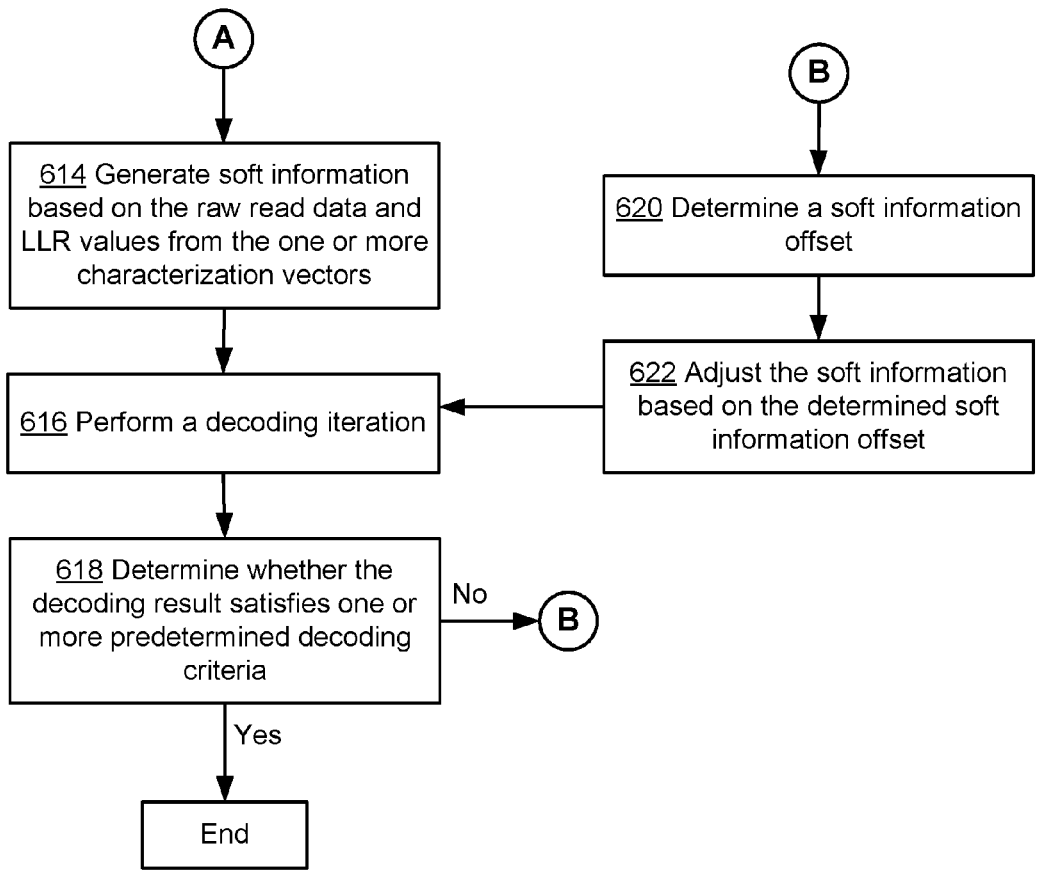

FIGS. 6A-6B illustrate a flow diagram of a process for improving decoding of data read from a storage device (e.g., storage medium 130, FIG. 1) with one or more memory devices, in accordance with some embodiments. In some embodiments, process 600 is performed by at least in part by a storage controller with one or more processors and memory. For example, in some embodiments, process 600 is performed by storage controller 124 (FIG. 1) or a component thereof (e.g., management module 121-1, FIGS. 1 and 3A). In some embodiments, process 600 is governed by instructions that are stored in a non-transitory computer readable storage medium (e.g., memory 306, FIG. 3A) and the instructions are executed by one or more processors of the electronic device (e.g., CPUs 122, FIGS. 1 and 3A).

The storage controller obtains (602), from a host, a read request. In some embodiments, the read request includes a logical address or a set of logical addresses for the data to be read from storage medium 130. For example, management module 121-1 or a component thereof (e.g., request handling module 310, FIG. 3A) receives a read request from computer system 110 via data connections 101 or, alternatively, a separate control line or bus. In another example, management module 121-1 or a component thereof (e.g., request handling module 310, FIG. 3A) receives a read request from a program or component internal to storage device 120 (e.g., a garbage collection program or a read patrol program).

The storage controller determines (604) a physical address or a set of physical addresses corresponding to the logical address or the set of logical addresses based on a logical-to-physical mapping. In some embodiments, management module 121-1 or a component thereof (e.g., mapping module 312, FIG. 3A) determines a physical address or set of physical addresses of storage medium 130 based on logical-to-physical mapping 336 and the logical address or set of logical addresses included in the read request received in operation 602.

The storage controller obtains (606) one or more characterization entries corresponding to the physical address or the set of physical addresses. In some embodiments, management module 121-1 or a component thereof (e.g., vector selecting module 326, FIG. 3A) identifies one or more characterization entries in characterization metrics table 338 that corresponds to the physical address or the set of physical addresses determined by mapping module 312 in operation 604. In some embodiments, a respective characterization entry (e.g., characterization entry 343-B, FIG. 3B) includes one or more characterization metrics corresponding to the memory portion(s) associated with the physical address or the set of physical addresses; an ECC type for data written, or to be written, to the physical address or the set of physical addresses; and a storage density for memory cells associated with the physical address or the set of physical addresses. In some embodiments, the respective characterization entry further includes one or more previously used reading threshold voltages, previously used LLR values, a previously determined soft information offset, and the like for the memory portion(s).

The storage controller selects (608) one or more characterization vectors with storage medium characterization parameters that match characterization metrics in the one or more characterization entries. In some embodiments, management module 121-1 or a component thereof (e.g., vector selecting module 326, FIG. 3A) identifies one or more characterization vectors in characterization vector table 340 (FIGS. 3A and 3C) with storage medium characterization parameters that match characterization metrics in the one or more characterization entries identified by vector selecting module 326 in operation 606. For example, vector selecting module 326 selects a closest matching characterization vector or a characterization vector with storage medium characterization parameters that are substantially equal to a predetermined number of characterization metrics in a characterization entry identified by vector selecting module 326 in operation 606. In some embodiments, a respective characterization vector includes one or more reading threshold voltages and one or more LLR values. For further description of characterization vectors, see the discussion of FIGS. 3C, 4B, and 5B above.

The storage controller provides (610) a memory access command to storage medium interface 128 with one or more reading threshold voltages from the one or more identified characterization vectors and the physical address or the set of physical addresses to obtain data from the storage medium. In some embodiments, management module 121-1 or a component thereof (e.g., data read module 314, FIG. 3A) provides a read access command to storage medium interface 128 to cause data to be read from storage medium 130. In some embodiments, the read access command includes the physical address or set of physical addresses determined by mapping module 312 in operation 604 and one or more reading threshold voltages included in the one or more characterization vectors identified by vector selecting module 326 in operation 608. Alternatively, in some embodiments, the read access command includes the physical address or set of physical addresses determined by mapping module 312 in operation 604 and one or more previously used reading threshold voltages included in the one or more characterization entries identified by vector selecting module 326 in operation 606. Subsequently, the read-write circuitry of storage medium interface 128 causes data to be read from the physical address or set of physical addresses of storage medium 130 according to the one or more reading threshold voltages.

In response to the memory access command, the storage controller obtains (612) raw read data (i.e., one or more codewords). In some embodiments, management module 121-1 or a component thereof receives raw read data from storage medium interface 128 in response to providing the memory access command in operation 610.

The storage controller generates (614) soft information based on the raw read data and the LLR values included in the one or more selected characterization vectors. In some embodiments, management module 121-1 or a component thereof (e.g., soft information generation module 328, FIG. 3A) generates soft information (herein called one or more soft information codewords) based on the raw read data obtained in operation 612 and the LLR values included in the one or more characterization vectors identified by vector selecting module 326 in operation 608. In some embodiments, management module 121-1 or a component thereof (e.g., soft information generation module 328, FIG. 3A) generates soft information (i.e., one or more soft information codewords) based on the raw read data obtained in operation 612 and previously used LLR values included in the one or more characterization entries identified by vector selecting module 326 in operation 606.

In some embodiments, soft information generation module 328 generates soft information values for each set of data read from storage medium 130 by utilizing a pre-generated collection of characterization vectors 345 in characterization vector table 340 (FIG. 3C) that includes soft information values for bit-tuples that may be read from the storage medium for various combinations of storage medium characterization parameter values. For example, soft information is generated by a device characterization process for memory devices produced by a particular manufacturing process, and stored in a characterization module or look-up table (e.g., characterization vector table 340, FIGS. 3A and 3C) accessible to management module 121-1.

The storage controller performs (616) a decoding iteration on the generated soft information. In some embodiments, management module 121-1 or a separate error control module (e.g., one of additional module(s) 125, FIG. 1) with a decoder performs a decoding iteration on the soft information generated by soft information generation module 328 in operation 614.

The storage controller determines (618) whether the decoding result of the decoding iteration satisfies one or more predetermined decoding criteria. In some embodiments, management module 121-1 or a component thereof (e.g., decoding determination module 330, FIG. 3A) determines whether the decoding result of operation 616 satisfies one or more predetermined decoding criteria. For example, the one or more predetermined decoding criteria include a maximum BER requirement (e.g., the number of corrected errors must not exceed a predefined number) and an error-free final result requirement.

In accordance with a determination that the one or more predetermined decoding criteria are satisfied, process 600 follows the "Yes" branch, and the decoding process ends. Subsequently, in some embodiments, the decoding result is provided to the host. In accordance with a determination that the one or more predetermined decoding criteria are not satisfied, process 600 follows the "No" branch to operation 620.

The storage controller determines (620) a soft information offset. In some embodiments, management module 121-1 or a component thereof (e.g., offset determining module 332, FIG. 3A) determines a soft information offset for the soft information based on soft information offset table 342 and the decoding result. In some embodiments, determining the soft information offset depends on whether the one or more codewords (i.e., the raw read data obtained in operation 612) include: (A) two sets of codeword portions, or (B) three or more sets of codeword portions. When the codeword includes two sets of codeword portions, the determination follows the bit-flip difference embodiment described in more detail below with reference to FIG. 7A. When the codeword includes three or more sets of codeword portions, the determination follows the average bit-flip embodiment described in more detail below with reference to FIG. 7B. In some embodiments, management module 121-1 or a component thereof (e.g., offset determining module 332, FIG. 3A) determines a soft information offset for the soft information codewords based on the decoding result and a previously used soft information offset included in the one or more characterization entries identified by vector selecting module 326 in operation 606.

The storage controller (622) adjusts the soft information based on the determined soft information offset. In some embodiments, management module 121-1 or a component thereof (e.g., soft information adjusting module 334, FIG. 3A) adjusts the soft information generated by soft information generation module 328 in operation 614 based on the soft information offset determined by offset determining module 332 in operation 620.

Subsequently, the storage controller performs a second decoding iteration on the adjusted soft information and repeats the determination in operation 618. In some embodiments, in accordance with a determination that the one or more predetermined decoding criteria are not satisfied after the second decoding iteration, the storage controller repeats operations 620-622. In some embodiments, in accordance with a determination that the one or more predetermined decoding criteria are not satisfied after the second decoding iteration, the storage controller skips operations 620-622 and performs a third decoding iteration on the adjusted soft information.

It should be understood that the particular order in which the operations in FIGS. 6A-6B have been described is merely exemplary and is not intended to indicate that the described order is the only order in which the operations could be performed. One of ordinary skill in the art would recognize various ways to reorder the operations described herein. Additionally, it should be noted that details of other processes described herein with respect to other methods and/or processes described herein (e.g., method 800) are also applicable in an analogous manner to process 600 described above with respect to FIGS. 6A-6B.

Figure 7A:
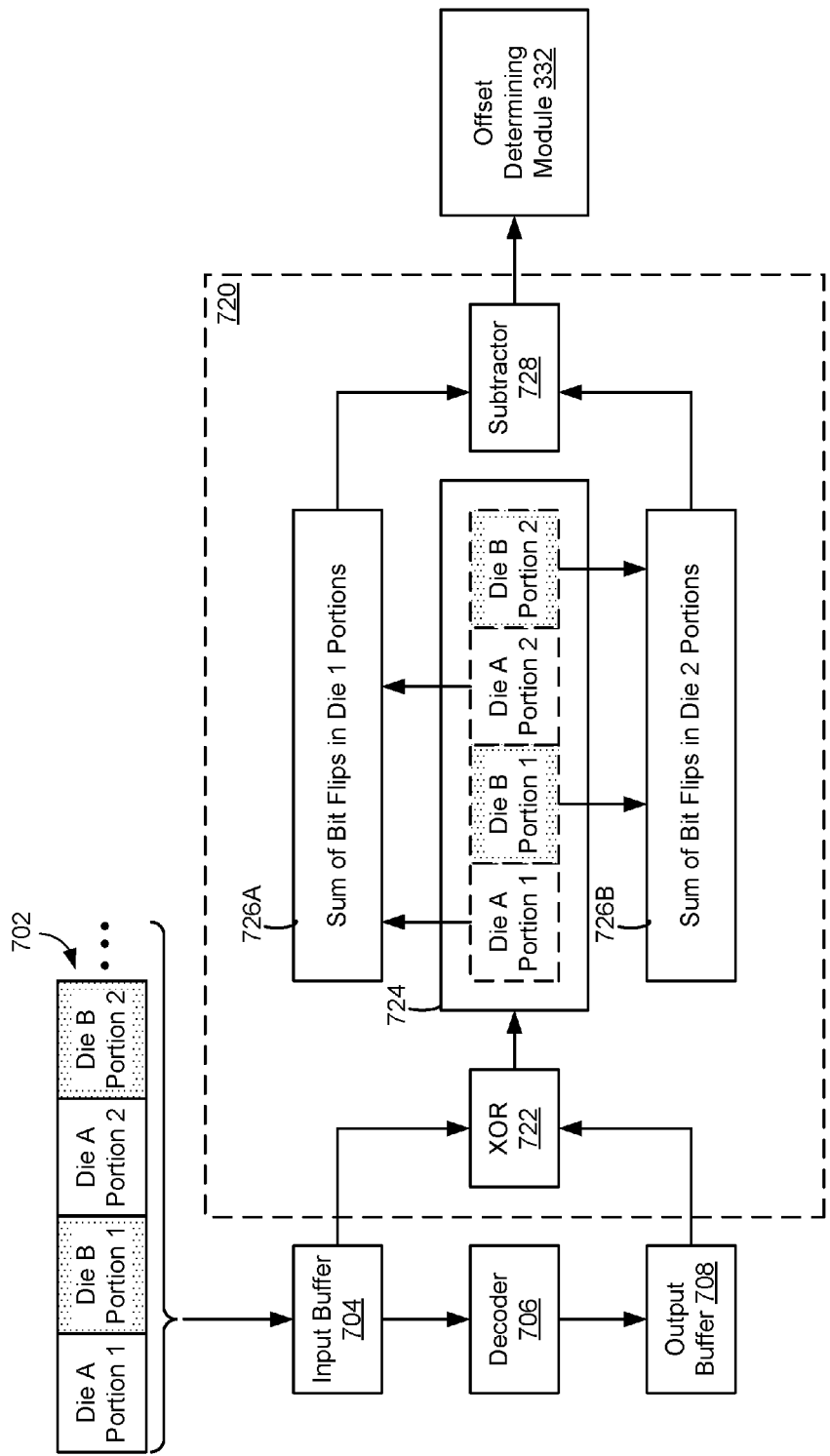
FIG. 7A is a block diagram of a first implementation of a pre-processing module for determining a soft information offset, in accordance with some embodiments.

FIG. 7A is a block diagram of a first implementation of a pre-processing module 720 for determining a soft information offset, in accordance with some embodiments. In some embodiments, pre-processing module 720 may be implemented in whole or in part by software, hardware, firmware, or any combination thereof by storage controller 124 (e.g., as a part of management module 121-1 or an error control module included in additional module(s) 125).

In some embodiments, codeword 702 (e.g., raw read data or hard-decision data) is read from storage medium 130. In FIG. 7A, codeword 702 is a two-die interleaved codeword including a first set of codeword portions from die A (e.g., with one or more portions including portion 1, die A; portion 2, die A; . . . ) and a second set of codeword portions from die B (e.g., with one or more portions including portion 1, die B; portion 2, die B; . . . ). FIG. 7A is described with reference to a two-die interleaved codeword; however, one of skill in the art will appreciate that various other codeword formats may be used in practice. For example, three or more-die interleaved codewords, N-die concatenated codewords, and the like may be used. Moreover, codewords may be composed of block, word line, word line zone, or sector based portions rather than die portions.

In some embodiments, codeword 702 is read from storage medium 130 and stored in input buffer 704 (e.g., storage medium interface 128 or an input buffer of the error control module) and provided from input buffer 704 to decoder 706 (e.g., a portion of the error control module) and XOR array 722 within pre-processing module 720. In some embodiments, codeword 702 is decoded by decoder 706 and the decoding result is stored in output buffer 708 (e.g., an output buffer of the error control module). In some embodiments, storage controller 124 or a component thereof (e.g., decoding determination module 330, FIG. 3A) (connections not shown) determines whether the decoding result stored in output buffer 708 satisfies one or more predetermined decoding criteria. Subsequently, in some embodiments, the decoding result is provided to XOR array 722 in accordance with a determination that the decoding result fails to satisfy one or more predetermined decoding criteria.

In some embodiments, XOR array 722 performs an XOR operation on codeword 702 (received from input buffer 704) and the decoding result (received from output buffer 708) to determine bit-flips signifying changed bits after a decoding iteration. For example, the output of XOR array 722 is stored in intermediate buffer 724. Summation module 726A determines a first count of bit-flips in the decoding result of the first set of codeword portions from die A based on the bit-flip data stored in intermediate buffer 724, and summation module 726B determines a second count of bit-flips in the decoding result of the second set of codeword portions from die B based on the bit-flip data stored in intermediate buffer 724. Alternatively, a single summation module is configured to sequentially determine bit-flip counts for each of the codeword portions.

In some embodiments, subtractor module 728 subsequently determines a difference or delta between the first count of bit-flips associated with die A and the second count of bit-flips associated with die B. In some embodiments, offset determining module 332 obtains the counts determined by summation modules 726A and 726B and determines a difference or delta between the first count of bit-flips associated with die A and the second count of bit-flips associated with die B. In some embodiments, offset determining module 332 determines a first soft information offset for the first set of codeword portions from die A and a second soft information offset for the second set of codeword portions from die B based on the difference between the first count of bit-flips associated with die A and the second count of bit-flips associated with die B and soft information offset table 342. For example, if the difference is −10 (i.e., 10 more bit-flips associated with the second set of codeword portions from die B as opposed to the first set of codeword portions from die A), offset determining module 332 determines first soft information offset for the first set of codeword portions from die A (e.g., set A) to be −1 and the second soft information offset for the second set of codeword portions from die B (e.g., set B) to be +1 based on soft information offset table 342 (as shown in FIG. 3D).

Figure 7B:
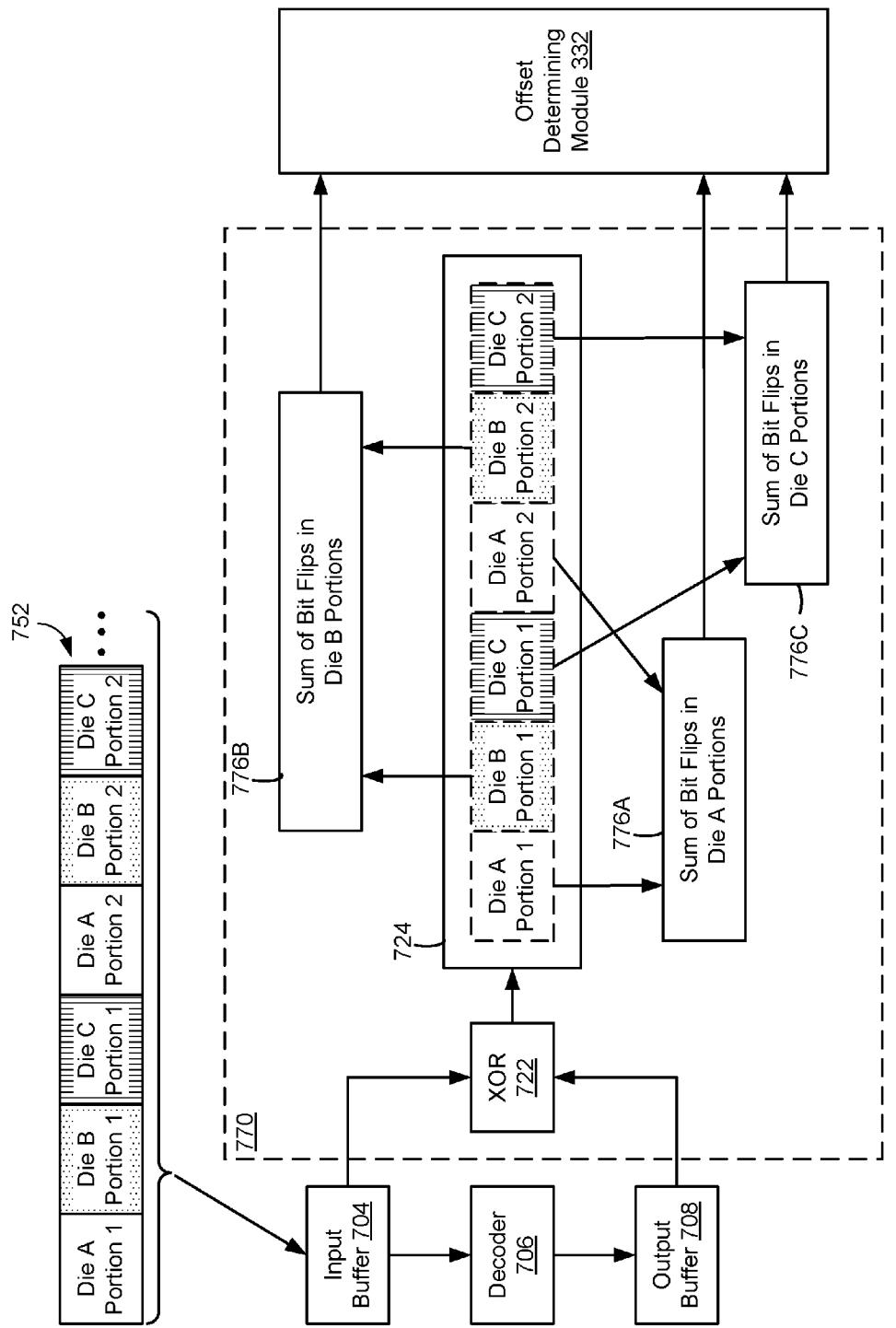
FIG. 7B is a block diagram of a second implementation of a pre-processing module for determining a soft information offset, in accordance with some embodiments.

FIG. 7B is a block diagram of a second implementation of a pre-processing module 770 for determining a soft information offset, in accordance with some embodiments. In some embodiments, pre-processing module 770 may be implemented in whole or in part by software, hardware, firmware, or any combination thereof. Pre-processing module 770 in FIG. 7B is similar to pre-processing module 720 in FIG. 7A. Elements common to both have been assigned the same reference numbers.

In some embodiments, codeword 752 (e.g., raw read data or hard-decision data) is read from storage medium 130. In FIG. 7B, codeword 752 is a three-die interleaved codeword including a first set of codeword portions from die A (e.g., with one or more portions including portion 1, die A; portion 2, die A; . . . ), a second set of codeword portions from die B (e.g., with one or more portions including portion 1, die B; portion 2, die B; . . . ), and a second set of codeword portions from die C (e.g., with one or more portions including portion 1, die C; portion 2, die C; . . . ). FIG. 7B is described with reference to a three-die interleaved codeword; however, one of skill in the art will appreciate that various other codeword formats may be used in practice. For example, four or more-die interleaved codewords, N-die concatenated codewords, and the like may be used. Moreover, codewords may be composed of block, word line, word line zone, or sector based portions rather than die portions.

In some embodiments, codeword 752 is read from storage medium 130 and stored in input buffer 704 (e.g., storage medium interface 128 or an input buffer of the error control module) and provided from input buffer 704 to decoder 706 (e.g., a portion of the error control module) and XOR array 722 within pre-processing module 770. In some embodiments, codeword 752 is decoded by decoder 706 and the decoding result is stored in output buffer 708 (e.g., an output buffer of the error control module). In some embodiments, storage controller 124 or a component thereof (e.g., decoding determination module 330, FIG. 3A) (connections not shown) determines whether the decoding result stored in output buffer 708 satisfies one or more predetermined decoding criteria. Subsequently, in some embodiments, the decoding result is provided to XOR array 722 in accordance with a determination that the decoding result fails to satisfy one or more predetermined decoding criteria.

In some embodiments, XOR array 722 performs an XOR operation on codeword 752 (received from input buffer 704) and the decoding result (received from output buffer 708) to determine bit-flips signifying changed bits after a decoding iteration. For example, the output of XOR array 722 is stored in intermediate buffer 724. Summation module 776A determines a first count of bit-flips in the decoding result of the first set of codeword portions from die A based on the bit-flip data stored in intermediate buffer 724, summation module 776B determines a second count of bit-flips in the decoding result of the second set of codeword portions from die B based on the bit-flip data stored in intermediate buffer 724, and summation module 776C determines a third count of bit-flips in the decoding result of the third set of codeword portions from die C based on the bit-flip data stored in intermediate buffer 724.

In some embodiments, offset determining module 332 obtains the counts determined by summation modules 776A, 776B, and 776C. Subsequently, offset determining module 332 determines a bit-flip average (BFA) by summing the first count from summation module 776A, the second count from summation module 776B, and the third count from summation module 776C and dividing the summation by three. Subsequently, offset determining module 332 determines a first deviation value (D1) by subtracting BFA from the first count determined by summation module 776A, a second deviation value (D2) by subtracting the BFA from the second count determined by summation module 776B, and a third deviation value (D3) by subtracting the BFA from the third count determined by summation module 776C. FIG. 3E, discussed above, shows an example of soft information offsets determined in accordance with the difference between the determined counts of bit flips in each set of codeword portions and the average number of bit-flips (BFA) in all the sets of codeword portions.

In some embodiments, offset determining module 332 determines whether a first soft information offset for the first set of codeword portions from die A will increase or decrease soft information values for the first set of codewords portions from die A based on the sign of D1, and offset determining module 332 determines the magnitude of the first soft information offset based on the absolute value of D1. In some embodiments, offset determining module 332 determines whether a second soft information offset for the second set of codeword portions from die B will increase or decrease soft information values for the second set of codewords portions from die B based on the sign of D2, and offset determining module 332 determines the magnitude of the second soft information offset based on the absolute value of D2. In some embodiments, offset determining module 332 determines whether a third soft information offset for the third set of codeword portions from die C will increase or decrease soft information values for the third set of codewords portions from die C based on the sign of D3, and offset determining module 332 determines the magnitude of the third soft information offset based on the absolute value of D3. One of skill in the art will appreciate that that the offset determination process described with reference to FIG. 7B may be applied to M-die codewords where M≥2.

Figure 8A:
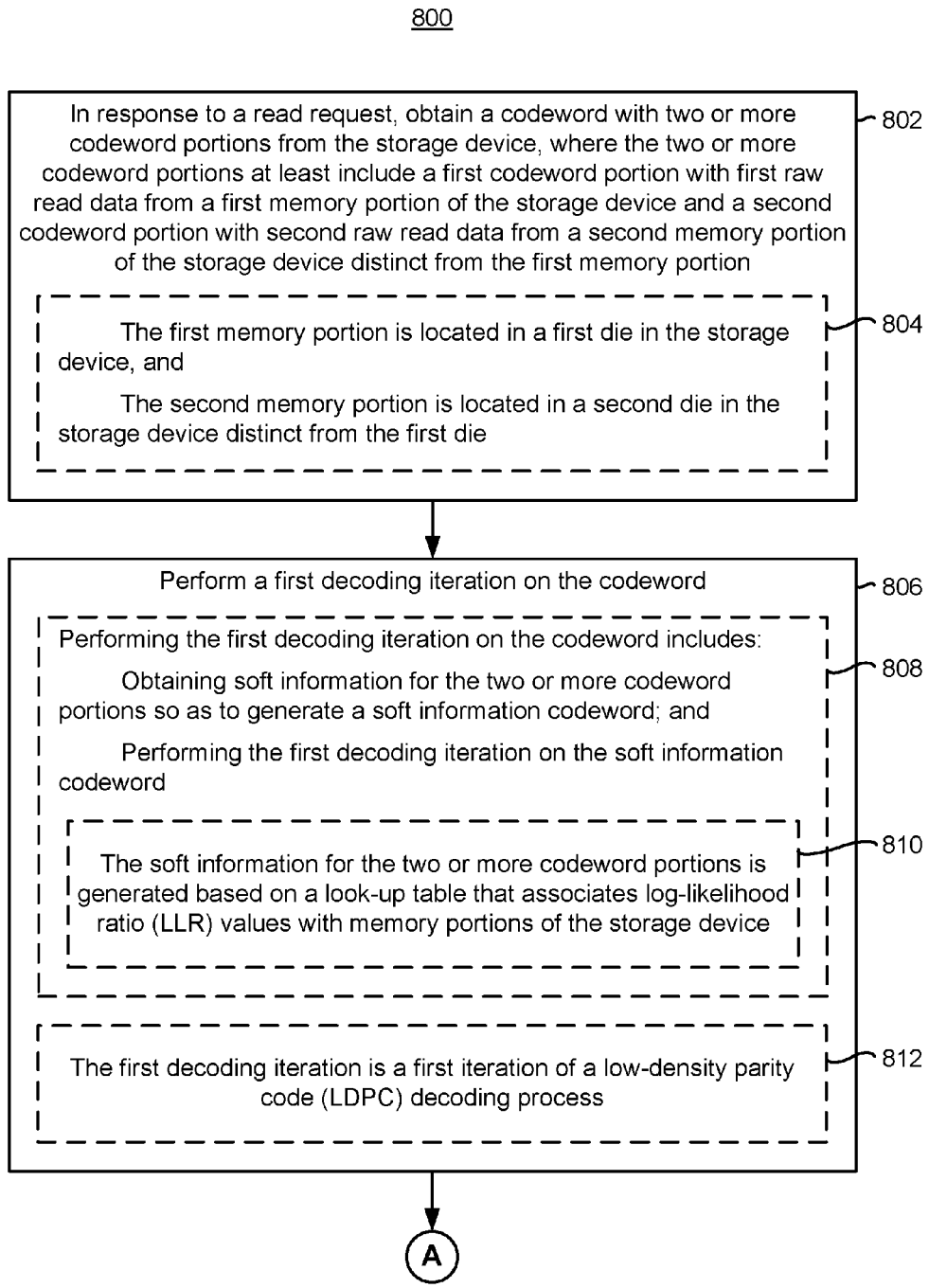
FIGS. 8A-8C illustrate a flowchart diagram of a method of improving decoding of data read from a storage device with one or more memory devices, in accordance with some embodiments.
Figure 8B:
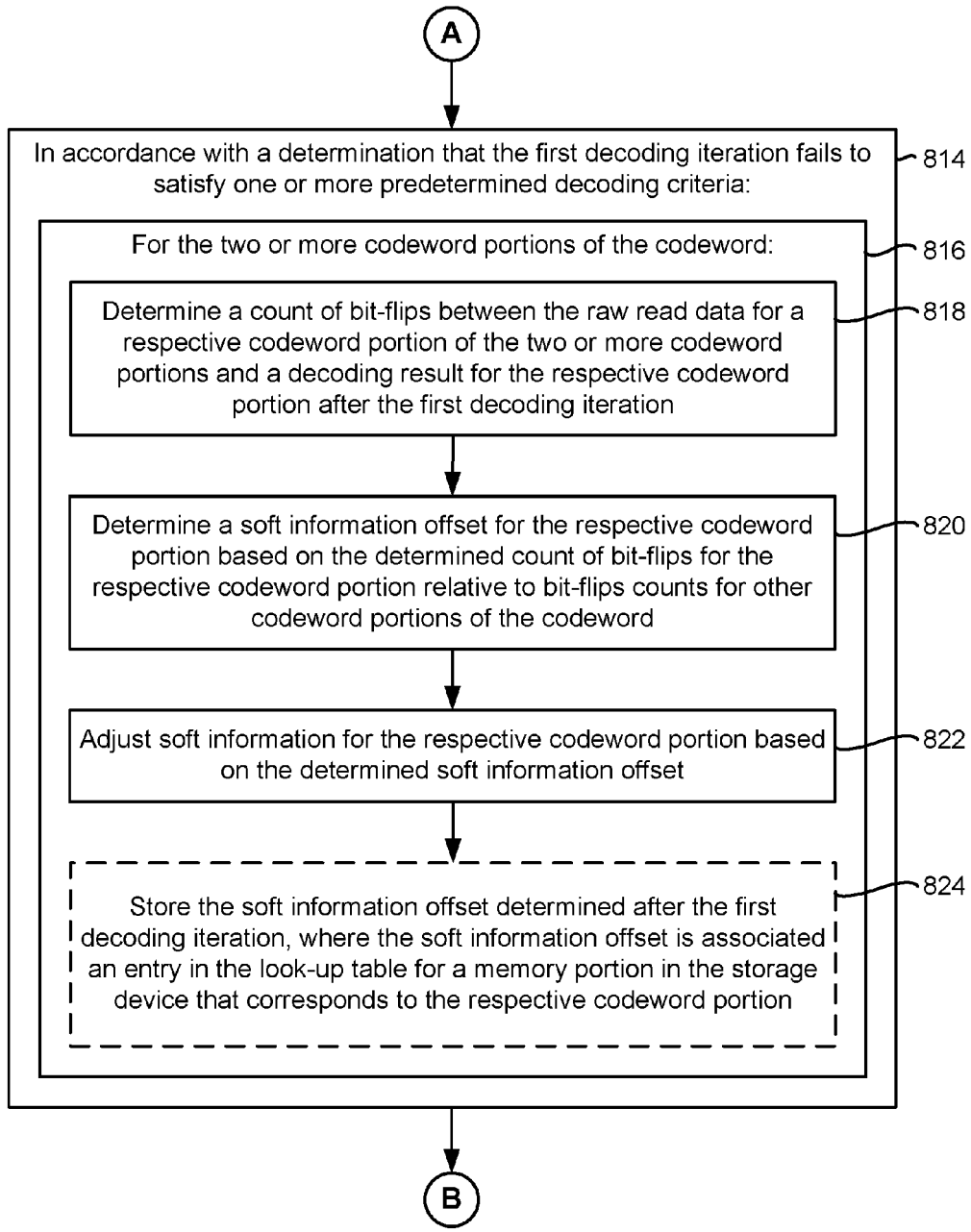
Figure 8C:
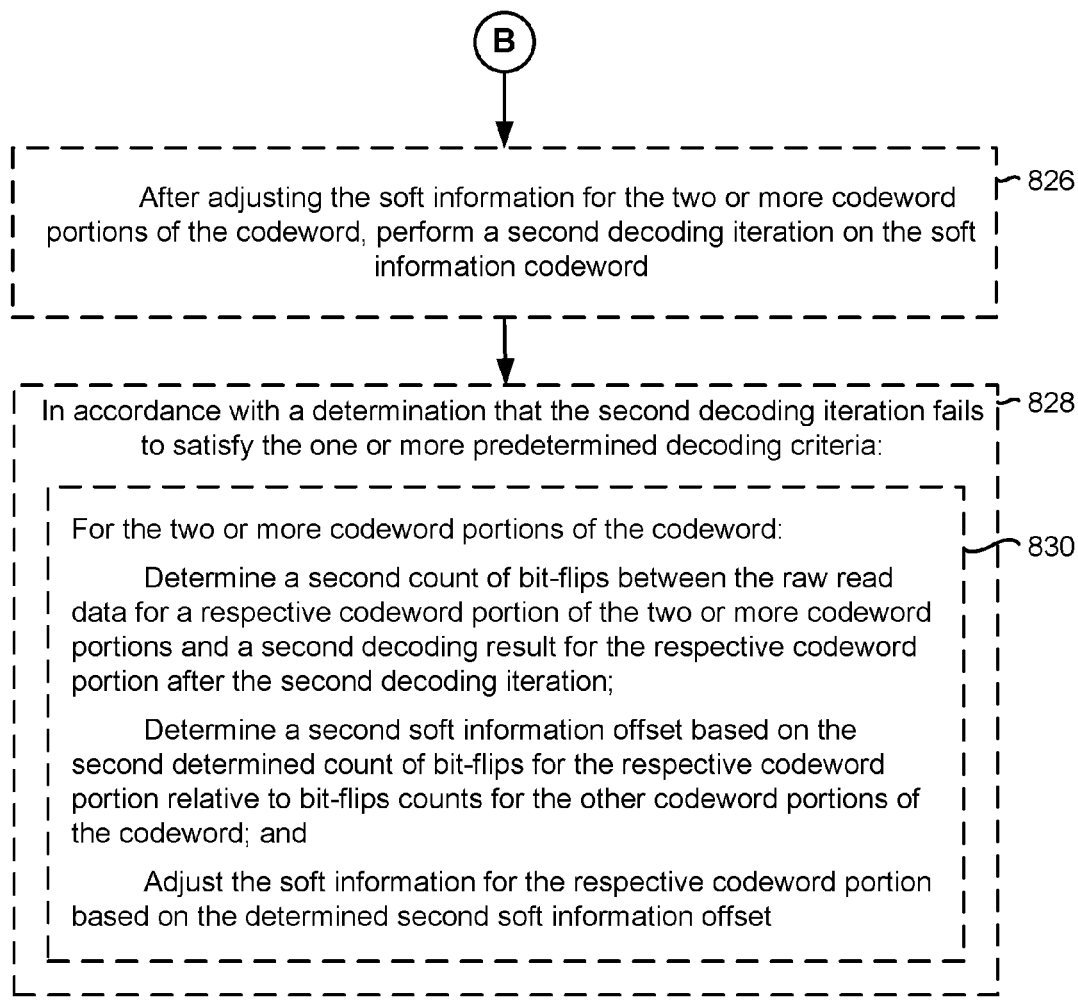

FIGS. 8A-8C illustrate a flowchart diagram of a method of improving decoding of data read from a storage device (e.g., storage medium 130, FIG. 1) with one or more memory devices, in accordance with some embodiments. In some embodiments, method 800 is performed by at least in part by a storage controller with one or more processors and memory. For example, in some embodiments, method 800 is performed by storage controller 124 (FIG. 1) or a component thereof (e.g., management module 121-1, FIGS. 1 and 3A). In some embodiments, method 800 is governed by instructions that are stored in a non-transitory computer readable storage medium (e.g., memory 306, FIG. 3A) and the instructions are executed by one or more processors of the electronic device (e.g., CPUs 122, FIGS. 1 and 3A). Optional operations are indicated by dashed lines (e.g., boxes with dashed-line borders).

In response to a read request, the storage controller obtains (802) a codeword with two or more codeword portions from the storage device, where the two or more codeword portions at least include a first codeword portion with first raw read data from a first memory portion of the storage device and a second codeword portion with second raw read data from a second memory portion of the storage device distinct from the first memory portion. In some embodiments, the read request is received from a host or an internal process. For example, management module 121-1 or a component thereof (e.g., request handling module 310, FIG. 3A) receives a read request from computer system 110 via data connections 101 or, alternatively, a separate control line or bus. In another example, management module 121-1 or a component thereof (e.g., request handling module 310, FIG. 3A) receives a read request from a program or component internal to storage device 120 (e.g., a garbage collection or a read patrol program). In some embodiments, the read request includes a logical address or a set of logical addresses for the data to be read from storage medium 130. In some embodiments, management module 121-1 or a component thereof (e.g., mapping module 312, FIG. 3A) determines one or more physical addresses of storage medium 130 based on logical-to-physical mapping 336 and the logical address or set of logical addresses included in the read request.

In some embodiments, management module 121-1 or a component thereof (e.g., vector selecting module 326, FIG. 3A) identifies one or more characterization entries in characterization metrics table 338 that corresponds to the one or more physical addresses that map to the logical address or set of logical addresses included in the read request. In some embodiments, a respective characterization entry (e.g., characterization entry 343-A, FIG. 3B) includes one or more characterization metrics corresponding to the memory portion(s) associated with the physical address or the set of physical addresses; an ECC type for data written, or to be written, to the physical address or the set of physical addresses; and a storage density for memory cells associated with the physical address or the set of physical addresses. In some embodiments, management module 121-1 or a component thereof (e.g., vector selecting module 326, FIG. 3A) identifies one or more characterization vectors in characterization vector table 340 (FIGS. 3A and 3C) with storage medium characterization parameters that match characterization metrics in the one or more characterization entries identified by vector selecting module 326. In some embodiments, a respective characterization vector (e.g., characterization vector 502, FIG. 5B) includes one or more reading threshold voltages and one or more LLR values.

In some embodiments, the storage device (e.g., storage medium 130, FIG. 1) includes one or more memory devices (e.g., flash memory devices) each with two or more die. For example, the raw read data is read from two or more die, two or more blocks, two or more memory devices, and/or the like of storage medium 130. As such, a memory portion is a respective memory device, die, block, or the like. In one example, the codeword is a two-die, byte-interleaved codeword. In this example, the first set of raw read data is obtained from a first die and the second set of raw read data is obtained from a second die and the codeword is interleaved with one byte from the first die, one byte from the second die, and so on. Of courses, there are many other examples of interleaving data of a codeword over two or more die or two or more other memory portions.

In some embodiments, the first memory portion is located (804) in a first die in the storage device, and the second memory portion is located in a second die in the storage device distinct from the first die. For example, codeword 702 in FIG. 7A is a two-die interleaved codeword including a first set of codeword portions from die A (e.g., with one or more portions including portion 1, die A; portion 2, die A; . . . ) and a second set of codeword portions from die B (e.g., with one or more portions including portion 1, die B; portion 2, die B; . . . ). Alternatively, in some embodiments, the memory portions are in distinct memory devices or distinct blocks of storage medium 130.

The storage controller performs (806) a first decoding iteration on the codeword. In some embodiments, the decoding is performed by an error correction module of the storage controller that is implemented in hardware, software, firmware, or a combination thereof. For example, management module 121-1 or a separate error control module (e.g., one of additional module(s) 125) with a decoder performs a first decoding iteration on the codeword read from storage medium 130.

In some embodiments, the storage controller performs (808) the first decoding iteration on the codeword by obtaining soft information for the two or more codeword portions so as to generate a soft information codeword, and performing the first decoding iteration on the soft information codeword. In some embodiments, management module 121-1 or a component thereof (e.g., vector selecting module 326, FIG. 3A) selects a characterization vector based on characteristics or usage history for the memory portions corresponding to the two or more codeword portions. For further discussion of characterization vector selection, see process 600 and more specifically operations 604-608. In some embodiments, management module 121-1 or a component thereof (e.g., soft information generation module 328, FIG. 3A) generates a soft information codewords based on the codeword obtained in operation 802 and LLR values included in the one or more characterization vectors identified by vector selecting module 326. In some embodiments, management module 121-1 or a component thereof (e.g., soft information generation module 328, FIG. 3A) generates the soft information based on previously used LLR values for the memory portions corresponding to the two or more codeword portions. For example, characterization entries 343 (e.g., stored in characterization metrics table 338, FIG. 3B) for the memory portions corresponding to the two or more codeword portions include the previously used LLR values.

In some embodiments, the soft information for the two or more codeword portions is generated (810) based on a look-up table that associates log-likelihood ratio (LLR) values with memory portions of the storage device. In some embodiments, an LLR look-up table (e.g., characterization vector table 340, FIGS. 3A and 3C) stores different sets of storage medium characterization parameter values. In some embodiments, management module 121-1 or a component thereof (e.g., vector selecting module 326, FIG. 3A) selects a characterization vector with a set of storage medium characterization parameter values that match (or substantially match) characteristics and historical/usage information (e.g., PE count, temperature, BER, word line position, and the like) for the memory portions corresponding to the two or more codeword portions.

In some embodiments, the codeword obtained in operation 802 is an LDPC-encoded codeword, and the first decoding iteration is (812) a first iteration of a low-density parity check (LDPC) decoding process.

In accordance with a determination that the first decoding iteration fails to satisfy one or more predetermined decoding criteria (for example, the number of bit corrected exceeds a threshold), the storage controller performs (814) a soft information adjustment process. In some embodiments, management module 121-1 or a component thereof (e.g., decoding determination module 330, FIG. 3A) determines whether the decoding result from the first decoding iteration satisfies one or more predetermined decoding criteria. For example, the one or more predetermined decoding criteria include a maximum BER or an error-free requirement.

For the two or more codeword portions of the codeword (816), the storage controller performs the soft information adjustment process by: (A) determining (818) a count of bit-flips between the raw read data for a respective codeword portion of the two or more codeword portions and a decoding result for the respective codeword portion after the first decoding iteration; (B) determining (820) a soft information offset for the respective codeword portion based on the determined count of bit-flips for the respective codeword portion relative to bit-flips counts for other codeword portions of the codeword; and (C) adjusting (822) soft information for the respective codeword portion based on the determined soft information offset. In some embodiments, the storage controller determines the count of bit-flips by performing an XOR operation between the raw read data for a respective codeword portion of the two or more codeword portions and a decoding result for the respective codeword portion after the first decoding iteration. In some embodiments, the XOR and summation operations for determining bit-flip counts for the first and second memory portions are performed in hardware as shown in FIGS. 7A-7B and described above. In some embodiments, management module 121-1 or a component thereof (e.g., offset determining module 332, FIG. 3A) determines soft information offsets for the first and second codeword portions based on soft information offset table 342 and the decoding result. In some embodiments, determining the soft information offset depends on whether the codeword includes: (A) two sets of codeword portions or (B) three or more sets of codeword portions. When the codeword includes two sets of codeword portions, the determination follows the delta bit-flip embodiment described in more detail above with reference to FIG. 7A. When the codeword includes three or more sets of codeword portions, the determination follows the average bit-flip embodiment described in more detail above with reference to FIG. 7B.

In some embodiments, the soft information for each set of codeword portions is adjusted based on its reliability (i.e., in terms of a number of bit-flips) relative to other sets of codeword portions. For example, the magnitude of the LLR values for a first codeword portion is adjusted (i.e., increased or decreased) based on the bit-flip count of the first codeword portion relative to the bit-flip counts of other codeword portions in the codeword (i.e., the delta between bit-flip counts). In some embodiments, management module 121-1 or a component thereof (e.g., soft information adjusting module 334, FIG. 3A) adjusts the soft information for the codeword portions based on based on the soft information offsets determined by offset determining module 332. In some embodiments, the main goal of the soft information adjustment process is to improve the decoding success rate and also reduce the number of decoding iterations.

In some embodiments, the storage controller stores (824) the soft information offset determined after the first decoding iteration, where the soft information offset is associated with an entry in the look-up table for a memory portion in the storage device that corresponds to the respective codeword portion. In some embodiments, management module 121-1 or a component thereof (e.g., metric maintaining module 324, FIG. 3A) stores the soft information offset in a characterization entry (e.g., in the "other info" field 338 of an entry 343 in characterization metrics table 338, FIGS. 3A-3B) corresponding to a memory portion associated with the respective codeword portion.

In some embodiments, the soft information offset for the respective codeword portion decreases the magnitude of the soft information for the respective codeword portion in accordance with a determination that the count of bit-flips for the respective codeword portion is greater than the bit-flips counts for the other codeword portions of the codeword, and the soft information offset for the respective codeword portion increases the magnitude of the soft information for the respective codeword portion in accordance with a determination that the count of bit-flips for the respective codeword portion is less than the bit-flips counts for the other codeword portions of the codeword. Stated another way, in these embodiments, the LLR magnitude is decreased for memory portions having a larger number of bit flips than the other memory portions (or the average memory portion), and the LLR magnitude is increased for memory portions having a smaller number of bit flips than the other memory portions (or the average memory portion).

Alternatively, in some embodiments (e.g., embodiments with a different decoder implementation than the embodiments described in the previous paragraph), the soft information offset for the respective codeword portion increases the magnitude of the soft information for the respective codeword portion in accordance with a determination that the count of bit-flips for the respective codeword portion is greater than the bit-flips counts for the other codeword portions of the codeword, and the soft information offset for the respective codeword portion decreases the magnitude of the soft information for the respective codeword portion in accordance with a determination that the count of bit-flips for the respective codeword portion is less than the bit-flips counts for the other codeword portions of the codeword. Stated another way, the direction in which the LLR magnitude is adjusted in based on both the decoder implementation and the determination of which memory portion(s) have more bit flips than the other memory portions. In general, though, the LLR magnitudes are adjusted in one way for memory portions having larger bit-flip counts and in the opposite way for memory portions having smaller bit-flip counts.

Furthermore, in some embodiments, the software information offsets are applied to "base" LLR values associated with the various memory portions, without retaining the adjusted LLR values for subsequent read operations from the same memory portions. However, in other embodiments, the software information offsets are cumulative for each memory portion and are stored in a lookup table, such as characterization metrics table 338, so that previously adjusted LLR values are used for subsequent read operations from the same memory portions.

In some embodiments, after adjusting the soft information for the two or more codeword portions of the codeword, the storage controller performs (826) a second decoding iteration on the soft information codeword. For example, after adjusting the soft information, management module 121-1 or a separate error control module (e.g., one of additional module(s) 125) with a decoder performs a second decoding iteration on the adjusted soft information codeword.

In some embodiments, in accordance with a determination that the second decoding iteration fails to satisfy the one or more predetermined decoding criteria, the storage controller performs (828) a second soft information adjustment process. In some embodiments, management module 121-1 or a component thereof (e.g., decoding determination module 330, FIG. 3A) determines whether the decoding result from the second decoding iteration satisfies the one or more predetermined decoding criteria. In some embodiments, the storage controller repeats the soft information adjustment process described above in operations 816-822 on the soft information codeword.

For the two or more codeword portions of the codeword, the storage controller performs (830) the second soft information adjustment process by: (A) determining a second count of bit-flips between the raw read data for a respective codeword portion of the two or more codeword portions and a second decoding result for the respective codeword portion after the second decoding iteration; (B) determining a second soft information offset based on the determined second count of bit-flips for the respective codeword portion relative to bit-flips counts for the other codeword portions of the codeword; and (C) adjusting the soft information for the respective codeword portion based on the determined second soft information offset.

It should be understood that the particular order in which the operations in FIGS. 8A-8C have been described is merely exemplary and is not intended to indicate that the described order is the only order in which the operations could be performed. One of ordinary skill in the art would recognize various ways to reorder the operations described herein. Additionally, it should be noted that details of other processes described herein with respect to other methods and/or processes described herein (e.g., process 600) are also applicable in an analogous manner to method 800 described above with respect to FIGS. 8A-8C.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible (e.g., a NOR memory array). NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned where some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The term "three-dimensional memory device" (or 3D memory device) is herein defined to mean a memory device having multiple memory layers or multiple levels (e.g., sometimes called multiple memory device levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

One of skill in the art will recognize that this invention is not limited to the two dimensional and three dimensional exemplary structures described but cover all relevant memory structures within the spirit and scope of the invention as described herein and as understood by one of skill in the art.

It will be understood that, although the terms "first," "second," etc. may be used herein to describe various elements, these elements should not be limited by these terms. These terms are only used to distinguish one element from another. For example, a first region could be termed a second region, and, similarly, a second region could be termed a first region, without changing the meaning of the description, so long as all occurrences of the "first region" are renamed consistently and all occurrences of the "second region" are renamed consistently. The first region and the second region are both regions, but they are not the same region.

The terminology used herein is for the purpose of describing particular embodiments only and is not intended to be limiting of the claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the phrase "at least one of A, B and C" is to be construed to require one or more of the listed items, and this phase reads on a single instance of A alone, a single instance of B alone, or a single instance of C alone, while also encompassing combinations of the listed items such "one or more of A and one or more of B without any of C," and the like.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of improving decoding of data read from a storage device with one or more memory devices, the method comprising:
  at a storage controller with one or more processors and memory:
    in response to a read request, obtaining a codeword with two or more codeword portions from the storage device, wherein the two or more codeword portions at least include a first codeword portion with first raw read data from a first memory portion of the storage device and a second codeword portion with second raw read data from a second memory portion of the storage device distinct from the first memory portion;
    performing a first decoding iteration on the codeword; and
    in accordance with a determination that the first decoding iteration fails to satisfy one or more predetermined decoding criteria:

for the two or more codeword portions of the codeword:
  determining a count of bit-flips between the raw read data for a respective codeword portion of the two or more codeword portions and a decoding result for the respective codeword portion after the first decoding iteration;
  determining a soft information offset for the respective codeword portion based on the determined count of bit-flips for the respective codeword portion relative to bit-flips counts for other codeword portions of the codeword; and
  adjusting soft information for the respective codeword portion based on the determined soft information offset.

2. The method of claim 1, wherein performing the first decoding iteration on the codeword includes:
  obtaining soft information for the two or more codeword portions so as to generate a soft information codeword; and
  performing the first decoding iteration on the soft information codeword.

3. The method of claim 2, wherein the soft information for the two or more codeword portions is generated based on a look-up table that associates log-likelihood ratio (LLR) values with memory portions of the storage device.

4. The method of claim 3, further comprising:
  storing the soft information offset determined after the first decoding iteration, wherein the soft information offset is associated with an entry in the look-up table for a memory portion in the storage device that corresponds to the respective codeword portion.

5. The method of claim 1, wherein the first decoding iteration is a first iteration of a low-density parity check (LDPC) decoding process.

6. The method of claim 1, wherein the first memory portion is located in a first die in the storage device, and wherein the second memory portion is located in a second die in the storage device distinct from the first die.

7. The method of claim 1, wherein the soft information offset for the respective codeword portion decreases the magnitude of the soft information for the respective codeword portion in accordance with a determination that the count of bit-flips for the respective codeword portion is greater than the bit-flips counts for the other codeword portions of the codeword, and
  wherein the soft information offset for the respective codeword portion increases the magnitude of the soft information for the respective codeword portion in accordance with a determination that the count of bit-flips for the respective codeword portion is less than the bit-flips counts for the other codeword portions of the codeword.

8. The method of claim 1, wherein the soft information offset for the respective codeword portion increases the magnitude of the soft information for the respective codeword portion in accordance with a determination that the count of bit-flips for the respective codeword portion is greater than the bit-flips counts for the other codeword portions of the codeword, and
  wherein the soft information offset for the respective codeword portion decreases the magnitude of the soft information for the respective codeword portion in accordance with a determination that the count of bit-flips for the respective codeword portion is less than the bit-flips counts for the other codeword portions of the codeword.

9. The method of claim 1, further comprising:
  after adjusting the soft information for the two or more codeword portions of the codeword, performing a second decoding iteration on the soft information codeword; and
  in accordance with a determination that the second decoding iteration fails to satisfy the one or more predetermined decoding criteria:
    for the two or more codeword portions of the codeword:
      determining a second count of bit-flips between the raw read data for a respective codeword portion of the two or more codeword portions and a second decoding result for the respective codeword portion after the second decoding iteration;
      determining a second soft information offset based on the determined second count of bit-flips for the respective codeword portion relative to bit-flips counts for the other codeword portions of the codeword; and
      adjusting the soft information for the respective codeword portion based on the determined second soft information offset.

10. The method of claim 1, wherein the storage device comprises one or more flash memory devices.

11. A storage device, comprising:
  non-volatile storage for storing information; and
  a storage controller having one or more processors configured to execute instructions in one or more programs, wherein the storage controller is configured to perform operations comprising:
    in response to a read request, obtaining a codeword with two or more codeword portions from the storage device, wherein the two or more codeword portions at least include a first codeword portion with first raw read data from a first memory portion of the storage device's non-volatile storage and a second codeword portion with second raw read data from a second memory portion of the storage device's non-volatile storage distinct from the first memory portion;
    performing a first decoding iteration on the codeword; and
    in accordance with a determination that the first decoding iteration fails to satisfy one or more predetermined decoding criteria:
      for the two or more codeword portions of the codeword:
        determining a count of bit-flips between the raw read data for a respective codeword portion of the two or more codeword portions and a decoding result for the respective codeword portion after the first decoding iteration;
        determining a soft information offset for the respective codeword portion based on the determined count of bit-flips for the respective codeword portion relative to bit-flips counts for other codeword portions of the codeword; and
        adjusting soft information for the respective codeword portion based on the determined soft information offset.

12. The storage device of claim 11, wherein the storage controller includes a decoding determination module for determining the decoding result.

13. The storage device of claim 11, wherein the storage controller includes an offset determining module for determining the soft information offset.

14. The storage device of claim 11, wherein the storage controller includes a soft information adjusting module for adjusting the soft information for the respective codeword portion.

15. The storage device of claim 11, wherein performing the first decoding iteration on the codeword includes:
obtaining soft information for the two or more codeword portions so as to generate a soft information codeword; and
performing the first decoding iteration on the soft information codeword.

16. The storage device of claim 15, wherein the soft information for the two or more codeword portions is generated based on a look-up table that associates log-likelihood ratio (LLR) values with memory portions of the storage device.

17. The storage device of claim 16, wherein the storage controller is further configured to perform operations comprising:
storing the soft information offset determined after the first decoding iteration, wherein the soft information offset is associated with an entry in the look-up table for a memory portion in the storage device that corresponds to the respective codeword portion.

18. The storage device of claim 11, wherein the first decoding iteration is a first iteration of a low-density parity check (LDPC) decoding process.

19. The storage device of claim 11, wherein the first memory portion is located in a first die in the storage device, and
wherein the second memory portion is located in a second die in the storage device distinct from the first die.

20. The storage device of claim 11, wherein the soft information offset for the respective codeword portion decreases the magnitude of the soft information for the respective codeword portion in accordance with a determination that the count of bit-flips for the respective codeword portion is greater than the bit-flips counts for the other codeword portions of the codeword, and
wherein the soft information offset for the respective codeword portion increases the magnitude of the soft information for the respective codeword portion in accordance with a determination that the count of bit-flips for the respective codeword portion is less than the bit-flips counts for the other codeword portions of the codeword.

21. The storage device of claim 11, the soft information offset for the respective codeword portion increases the magnitude of the soft information for the respective codeword portion in accordance with a determination that the count of bit-flips for the respective codeword portion is greater than the bit-flips counts for the other codeword portions of the codeword, and
wherein the soft information offset for the respective codeword portion decreases the magnitude of the soft information for the respective codeword portion in accordance with a determination that the count of bit-flips for the respective codeword portion is less than the bit-flips counts for the other codeword portions of the codeword.

22. The storage device of claim 11, wherein the storage controller is further configured to perform operations comprising:
after adjusting the soft information for the two or more codeword portions of the codeword, performing a second decoding iteration on the soft information codeword; and
in accordance with a determination that the second decoding iteration fails to satisfy the one or more predetermined decoding criteria:
for the two or more codeword portions of the codeword:
determining a second count of bit-flips between the raw read data for a respective codeword portion of the two or more codeword portions and a second decoding result for the respective codeword portion after the second decoding iteration;
determining a second soft information offset based on the determined second count of bit-flips for the respective codeword portion relative to bit-flips counts for the other codeword portions of the codeword; and
adjusting the soft information for the respective codeword portion based on the determined second soft information offset.

23. A non-transitory computer readable storage medium, storing one or more programs configured for execution by one or more processors of a storage device, the one or more programs including instructions for performing operations comprising:
in response to a read request, obtaining a codeword with two or more codeword portions from the storage device, wherein the two or more codeword portions at least include a first codeword portion with first raw read data from a first memory portion of the storage device and a second codeword portion with second raw read data from a second memory portion of the storage device distinct from the first memory portion;
performing a first decoding iteration on the codeword; and
in accordance with a determination that the first decoding iteration fails to satisfy one or more predetermined decoding criteria:
for the two or more codeword portions of the codeword:
determining a count of bit-flips between the raw read data for a respective codeword portion of the two or more codeword portions and a decoding result for the respective codeword portion after the first decoding iteration;
determining a soft information offset for the respective codeword portion based on the determined count of bit-flips for the respective codeword portion relative to bit-flips counts for other codeword portions of the codeword; and
adjusting soft information for the respective codeword portion based on the determined soft information offset.

* * * * *